United States Patent
Asakura et al.

(10) Patent No.: US 11,538,671 B2
(45) Date of Patent: *Dec. 27, 2022

(54) PLASMA PROCESSING APPARATUS AND DATA ANALYSIS APPARATUS

(71) Applicant: Hitachi High-Technologies Corporation, Tokyo (JP)

(72) Inventors: Ryoji Asakura, Tokyo (JP); Kenji Tamaki, Tokyo (JP); Akira Kagoshima, Tokyo (JP); Daisuke Shiraishi, Tokyo (JP); Masahiro Sumiya, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/666,842

(22) Filed: Oct. 29, 2019

(65) Prior Publication Data

US 2020/0066500 A1    Feb. 27, 2020

Related U.S. Application Data

(63) Continuation of application No. 15/050,631, filed on Feb. 23, 2016, now Pat. No. 10,510,519.

(30) Foreign Application Priority Data

Jun. 26, 2015   (JP) .................................. 2015-129022

(51) Int. Cl.
*H01J 37/32* (2006.01)
(52) U.S. Cl.
CPC .............................. *H01J 37/32972* (2013.01)
(58) Field of Classification Search
CPC ... H01J 37/32972; H05H 1/0037; H01L 22/10
See application file for complete search history.

(56) References Cited

U.S. PATENT DOCUMENTS 8,992,721 B2    3/2015  Kagoshima et al.
2011/0315661 A1   12/2011  Morisawa et al.
(Continued)

FOREIGN PATENT DOCUMENTS

JP    2007-214254 A    8/2007
JP     2011-82441 A    4/2011
(Continued)

OTHER PUBLICATIONS

Taiwanese Office Action received in corresponding Taiwanese Application No. 105104762 dated Nov. 29, 2016.
(Continued)

*Primary Examiner* — Yuechuan Yu
(74) *Attorney, Agent, or Firm* — Mattingly & Malur, PC

(57) ABSTRACT

In time-series data indicating light emission of plasma when plasma processing is carried out on a sample by generating the plasma, an analysis apparatus creates combinations of a plurality of light emission wavelengths of elements and a plurality of time intervals within a plasma processing interval and calculates, for each of the combinations of the wavelengths and the time intervals, a correlation between an average value of light emission intensity and the number of times the plasma processing is carried out on the samples for each of the combinations of the wavelengths and the time intervals that have been created. Thereafter, the data analysis apparatus selects, as a combination of the wavelength and the time interval used to observe or control the plasma processing, a combination of a wavelength of light emitting from a specific element and a specific time interval having a maximum correlation.

5 Claims, 18 Drawing Sheets

(56) References Cited

U.S. PATENT DOCUMENTS

| | | | |
|---|---|---|---|
| 2012/0310403 | A1 | 12/2012 | Morisawa et al. |
| 2014/0022540 | A1 | 1/2014 | Asakura et al. |
| 2015/0083328 | A1 | 3/2015 | Asakura et al. |

FOREIGN PATENT DOCUMENTS

| | | | |
|---|---|---|---|
| JP | 2011-181575 A | 9/2011 |
| JP | 2014-179474 A | 9/2014 |
| JP | 5596832 B2 | 9/2014 |
| JP | 2015-61005 A | 3/2015 |
| KR | 10-2014-0119066 A | 10/2014 |
| KR | 10-2015-0032768 A | 3/2015 |
| TW | 201133611 A1 | 10/2011 |
| TW | 201409565 A | 3/2014 |
| TW | 201513209 A | 4/2015 |

OTHER PUBLICATIONS

Korean Office Action received in corresponding Korean Application No. 10-2016-0006841 dated Feb. 16, 2017.
Japanese Office Action received in corresponding Japanese Application No. 2015-129022 dated Jan. 29, 2019.

FIG. 4

| | | | | | | | |
|---|---|---|---|---|---|---|---|
| NUMBER OF TIMES OF LOT PROCESSING | 1 | 1 | ... | 1 | 2 | 2 | ... |
| NUMBER OF TIMES OF WAFER PROCESSING PER LOT | 1 | 2 | ... | 10 | 1 | 2 | ... |
| TOTAL NUMBER OF TIMES OF WAFER PROCESSING | 1 | 2 | ... | 10 | 11 | 12 | ... |
| OES DATA ID | p101 | p102 | ... | p110 | p201 | p202 | ... |

FIG. 5

| OES DATA ID | | |  | WAVELENGTH | | |
|---|---|---|---|---|---|---|
| p101 | 1 | 201 | 202 | ... | 800 |
| | 2 | 103 | 103 | ... | 77 |
| | ... | 107 | 108 | ... | 82 |
| PLASMA PROCESSING INTERVAL | 100 | 140 | 142 | ... | 96 |

FIG. 7

| WAVELENGTH ID 26b | ELEMENT 26c | WAVELENGTH 26d | TIME INTERVAL 26e | DETERMINATION COEFFICIENT AVERAGE 26f | DIRECTION OF CORRELATION 26g | MATCHING OF CORRELATION DIRECTION 26h | MAXIMUM DETERMINATION COEFFICIENT 26i | EMPLOYMENT CANDIDATE 26j |
|---|---|---|---|---|---|---|---|---|
| 1 | Si | 251 | 51-100 | 0.89 | + | ○ |  | ○ |
| 2 | Si | 288 | 51-100 | 0.92 | + | ○ | ○ | ◎ |
| 3 | Al | 308 | 1-50 | 0.52 | − | × |  |  |
| 4 | Al | 309 | 1-50 | 0.48 | − | × |  |  |
| 5 | Al | 394 | 51-100 | 0.82 | + | × |  |  |
| 6 | Al | 396 | 51-100 | 0.73 | + | × |  |  |
|  | ... | ... | ... | ... | ... | ... | ... |  |

| | 210b | 210c | 210d | 210e | 210f DETERMINATION COEFFICIENT PER LOT | | | 210g | 210h | 210i REGRESSION EQUATION SLOPE PER LOT | | | 210j | 210k |
|---|---|---|---|---|---|---|---|---|---|---|---|---|---|---|
| 210a | WAVELENGTH ID | ELEMENT | WAVELENGTH | TIME INTERVAL | 1 | 2 | ... | DETERMINATION COEFFICIENT AVERAGE | MAXIMUM DETERMINATION COEFFICIENT AVERAGE | 1 | 2 | ... | SLOPE AVERAGE | DIRECTION OF CORRELATION |
| | 1 | Si | 251 | 1–50 | 0.81 | 0.77 | ... | 0.80 | | 6.9 | 7.3 | ... | 7.2 | + |
| | 1 | Si | 251 | 51–100 | 0.93 | 0.90 | ... | 0.89 | ○ | 7.6 | 8.5 | ... | 7.7 | + |
| | ... | ... | ... | ... | ... | ... | ... | ... | | ... | ... | ... | ... | ... |

FIG. 14

| WAVELENGTH ID | ELEMENT | WAVELENGTH | TIME INTERVAL | DETERMINATION COEFFICIENT PER LOT | | ... | DETERMINATION COEFFICIENT AVERAGE | MAXIMUM DETERMINATION COEFFICIENT AVERAGE |
|---|---|---|---|---|---|---|---|---|
| | | | | 1 | 2 | ... | | |
| 2 | Si | 288 | 1–10 | 0.51 | 0.69 | ... | 0.55 | |
| 2 | Si | 288 | 11–20 | 0.58 | 0.42 | ... | 0.47 | |
| ... | ... | ... | ... | ... | ... | ... | ... | ... |
| 2 | Si | 288 | 45–97 | 0.94 | 0.90 | ... | 0.94 | ○ |
| ... | ... | ... | ... | ... | ... | ... | ... | ... |

211b — WAVELENGTH ID
211c — ELEMENT
211d — WAVELENGTH
211e — TIME INTERVAL
211f — DETERMINATION COEFFICIENT PER LOT
211g — DETERMINATION COEFFICIENT AVERAGE
211h — MAXIMUM DETERMINATION COEFFICIENT AVERAGE
211a

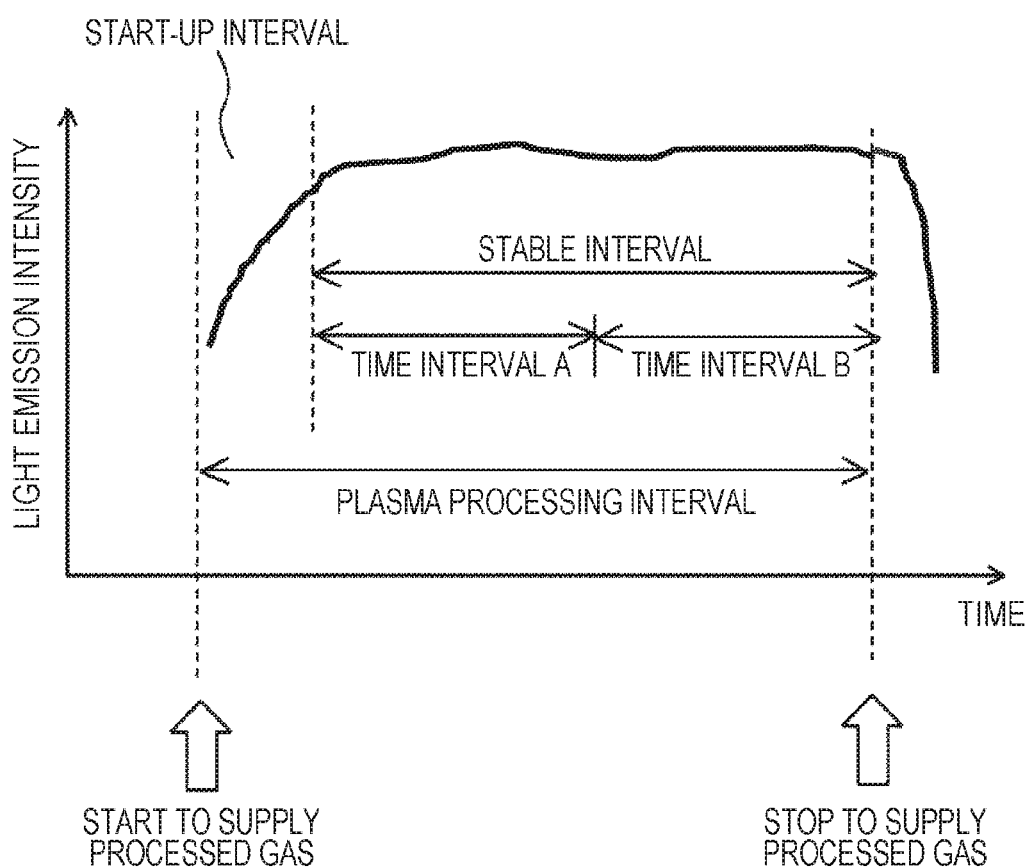

PLASMA PROCESSING APPARATUS AND DATA ANALYSIS APPARATUS

BACKGROUND OF THE INVENTION

1. Field of the Invention

The present invention relates to a plasma processing apparatus that processes a sample such as a semiconductor wafer using plasma and a data analysis apparatus thereof. In particular, the invention relates to a technique for analyzing data of the sample during plasma processing and carrying out plasma processing on the sample using the data.

2. Description of the Related Art

In order to obtain a fine shape on a semiconductor device formed on a sample, plasma processing is carried out by producing an ionized state (plasma state) of a substance within a chamber and removing the substance on a wafer through an action of the substance (reaction on a wafer surface).

Because an ionization phenomenon using plasma accompanies a light emission phenomenon, a plasma processing apparatus that uses plasma to carry out the processing is equipped with a spectrometer such that the light emitting from plasma can be monitored. Data measured by the spectrometer is hereinafter referred to as optical emission spectroscopy (OES) data.

When a great number of wafers are subjected to similar plasma processing, in order to obtain a constant result from each processing, OES data, a voltage value, and other data for monitoring the plasma processing are used to observe or control the plasma processing.

JP-2007-214254-A discloses a method for acquiring, using the plasma processing apparatus, time-series data such as a voltage value of a matching box in a stable discharge region where plasma discharge is stable and for using a difference or a standard deviation of values from the acquired time-series data in a specified time interval to observe the plasma processing and detect abnormality.

JP-5596832-B2 discloses a method for using the OES data during the plasma processing for run-to-run control of the plasma processing in order to reflect a process state of the apparatus to the plasma processing.

SUMMARY OF THE INVENTION

In plasma processing, as the plasma processing for a wafer is repeated, a state of a reaction product adhered to a wall surface within a chamber where the plasma processing is carried out or the degree of wear of components varies over time. When the variation over time in the adhesion of the reaction product or the wear of components can be measured from OES data, an apparatus can be properly managed or controlled in accordance with an adhesion state of the reaction product or a wear state of components.

As will be described later, the OES data is massive data obtained by measuring light emission intensity for each of combinations of wavelengths and time periods of light emission. Values of the OES data differ depending on the wavelengths of light emission and also vary as the time elapses during the plasma processing. Therefore, it is desirable to identify, among the massive data including a great number of combinations of the wavelengths and the time intervals of light emission, the optimum combination of the wavelength and the time interval used to observe or control the plasma processing.

The method disclosed in JP-2007-214254-A collects time-series data for one data collection time period to evaluate whether the data exceeds a predetermined value. JP-2007-214254-A does not describe a method for determining, among the massive time-series data that has been acquired, the optimum data used to calculate a difference or a standard deviation, namely, the optimum time interval for which abnormality is detected.

Likewise, the method disclosed in JP-5596832-B2 does not provide a method for identifying, among the massive OES data, the optimum data (a light emission wavelength and a time interval) used to control the plasma processing.

An object of the invention is to provide a data analysis apparatus that identifies the optimum data (a light emission wavelength and a time interval) used to control the plasma processing and a plasma processing apparatus that achieves stable plasma processing using the data.

In order to accomplish the object described above, a data analysis apparatus according to a representative example of the invention creates combinations of wavelengths and time intervals within a bandwidth of a plasma emission wavelength generated when the plasma processing is carried out on a wafer by generating plasma, and calculates, per lot, a correlation between the number of times of wafer processing and the light emission intensity in regard to the respective combinations of the wavelengths and the time intervals that have been created. Thereafter, among the combinations of the wavelengths and the time intervals, the data analysis apparatus selects, as a wavelength and a time interval used to observe or control the plasma processing, one combination having a high correlation calculated per lot.

The invention makes it possible to identify, among the massive OES data, a combination of a specific wavelength and a specific time interval used to observe or control the plasma processing in a short time to achieve a stable result of the plasma processing.

BRIEF DESCRIPTION OF THE DRAWINGS

FIG. 4 is an exemplary table of data for the number of times of wafer processing held in a storage unit of the data analysis apparatus in FIG. 1;

FIG. 5 is an exemplary table of the OES data held in the storage unit in FIG. 1;

FIG. 7 is an exemplary table of correlation data held in the storage unit in FIG. 1;

FIG. 11 is an exemplary table of intermediate data stored during the analysis processing in FIG. 9;

FIG. 14 is an exemplary table of detailed analysis intermediate data stored in the middle of detailed analysis processing in FIG. 9;

FIG. 16 is a diagram for explaining time intervals of the plasma processing in a second working example of the invention;

DESCRIPTION OF THE PREFERRED EMBODIMENTS

Figure 1:
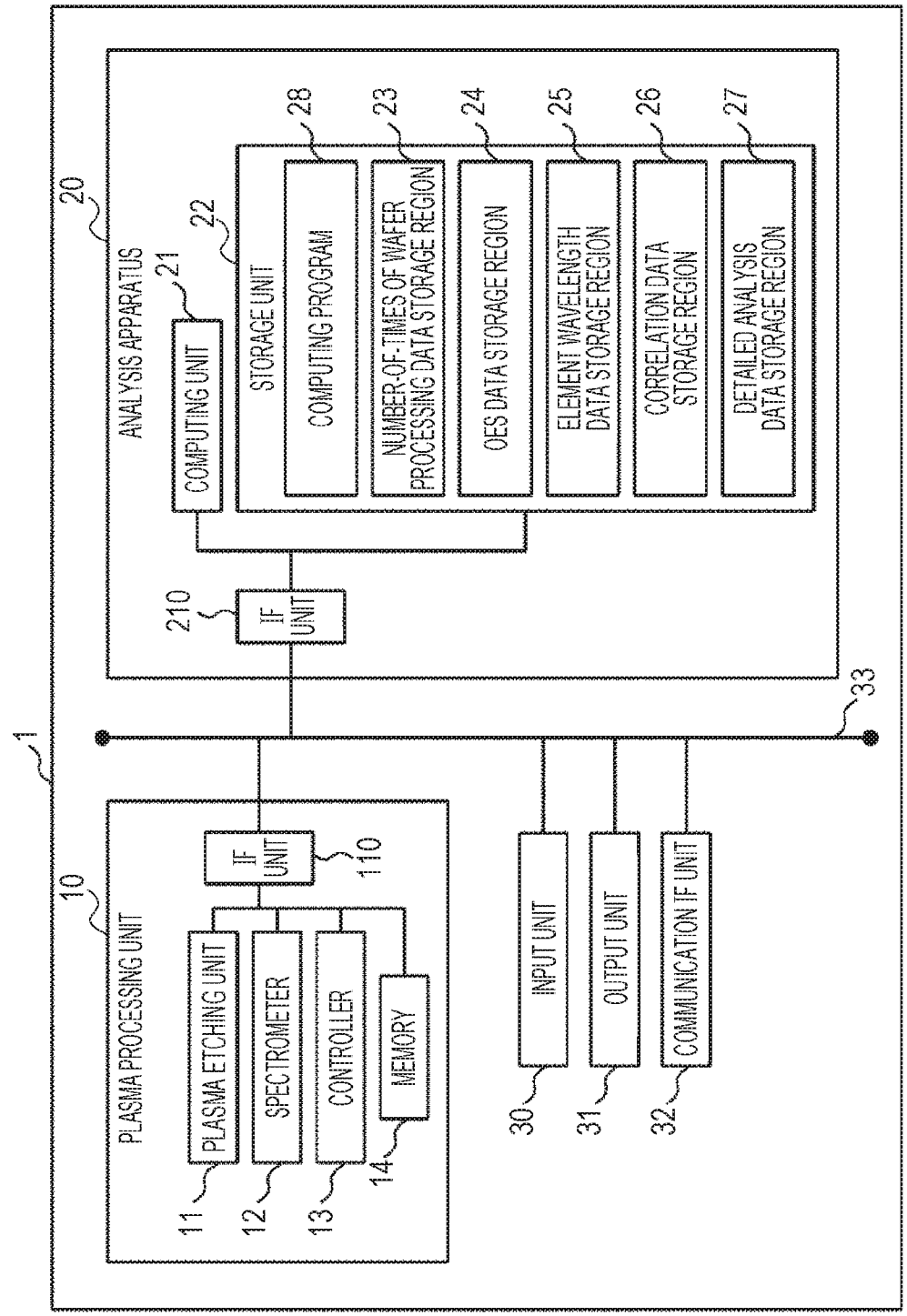
FIG. 1 is a block diagram illustrating a configuration of a plasma processing apparatus including a data analysis apparatus according to a first working example of the invention.

According to a representative embodiment of the invention, a plasma processing apparatus including a data analysis apparatus acquires plasma emission data (OES data) indicating light emission intensity of a plurality of elements for wavelengths and time periods obtained during plasma processing and data for the number of times of wafer processing and, in regard to a plurality of combinations constituted by different wavelengths and different time intervals in the plasma emission data, evaluates the degree of correlation between an average value of the light emission intensity and the number of times of wafer processing for the each combination of the wavelength and the time interval to identify a combination of the wavelength and the time interval having a high correlation in the plasma emission data. Additionally, the data analysis apparatus is configured to carry out processing of creating combinations of the wavelengths of the respective elements and the plurality of time intervals within a bandwidth of the plasma emission wavelength during the plasma processing for a wafer; calculating, per lot, a correlation between the number of times of wafer processing and the light emission intensity in regard to the respective combinations that have been created; and selecting, as "a specific wavelength and a specific time interval" used to observe or control the plasma processing, one combination having a high correlation calculated per lot among these combinations. Note that, in the invention, respective chemical elements or chemical compounds contained in plasma are defined as elements, whereas a combination of a specific element among these elements and a wavelength of the light emitting from that element is defined as a "wavelength ID".

Hereinafter, embodiments of the invention will be described based on the drawings. Note that similar members are denoted by similar reference numerals as a basic rule to describe the embodiments and repeated descriptions thereof will be omitted.

First Working Example

A plasma processing apparatus including a data analysis apparatus according to a first working example of the invention will be described in detail with reference to FIGS. 1 to 15B.

Plasma Processing Apparatus

As illustrated in a configuration diagram in FIG. 1, the plasma processing apparatus 1 includes a plasma processing unit 10, a data analysis apparatus 20, an input unit 30, an output unit 31, and a communication interface unit (communication IF unit) 32, which are interconnected via a bus 33.

The plasma processing unit 10 includes a plasma etching unit 11, a spectrometer 12, a controller 13, and a memory unit 14, which are connected to the bus 33 via an interface unit (IF unit) 110. The plasma etching unit 11 generates plasma within a chamber thereof to process a wafer (etching processing). The spectrometer 12 acquires OES data serving as light emission data for plasma during the etching processing for the wafer. The spectrometer 12 functioning as a process monitor decomposes light from plasma, which varies depending on processes of the etching processing, into respective wavelengths and acquires data for intensity of the respective wavelengths. The OES data is stored to a storage unit 22 included in the data analysis apparatus 20 via the IF unit 110. The controller 13 controls processing in the plasma etching unit 11. The memory unit 14 holds data such as programs and processing recipes for carrying out the plasma processing. The plasma processing unit 10 will be described in detail with reference to FIG. 2 described later.

The data analysis apparatus 20 carries out data analysis processing to identify a combination of the wavelength and the time interval used to observe or control the plasma processing. The data analysis apparatus 20 includes a computing unit 21 that analyzes data, the storage unit 22, and an interface unit (IF unit) 210.

The storage unit 22 includes a number-of-times of wafer processing data storage region 23 that stores the number of times of wafer processing, an OES data storage region 24 that stores measurement values (OES data) obtained by the spectrometer during the etching processing, an element wavelength data storage region 25 that stores, as the wavelength ID, information on a wavelength of the light emitting from an element ("wavelength of element"), a correlation data storage region 26 that stores data of results of the analysis processing carried out by the computing unit 21, a detailed analysis data storage region 27 that stores data of results of detailed analysis processing carried out by the computing unit 21, and a computing program 28.

The computing unit 21 uses the data for the number of times of wafer processing stored in the number-of-times of wafer processing data storage region 23, the OES data stored in the OES data storage region 24, and the wavelength ID stored in the element wavelength data storage region 25 in the storage unit 22 to execute the computing program 28, thereby carrying out processing of sequentially evaluating the correlation between the light emission intensity and the number of times of wafer processing for each of the combinations of the wavelengths and the time intervals and identifying a combination of the wavelength and the time interval used to observe and control the plasma processing. The analysis processing carried out by the computing unit 21 by executing the computing program 28 will be described in detail later.

The input unit 30 is a mouse, a keyboard, or the like that receives information input through user operation. The output unit 31 is a display, a printer, or the like that outputs information for a user. The input unit 30 and the output unit 31 may be integrated as an input/output unit including a user interface. The communication IF unit 32 is an interface for transmitting/receiving information to/from another apparatus or system (an existing production management system or the like can be also connected) connected via the bus 33, an external network, or the like. The bus 33 couples the respective units (10, 20, 30, 31, and 32) to each other. The IF units (110, 210, and the like) of the respective units are interfaces for transmitting/receiving information via the bus 33. The analysis apparatus 20 may be configured as an independent analysis apparatus and connected to the plasma processing apparatus including the plasma processing unit 10 via the IF unit 210.

Plasma Processing Unit

Figure 2:
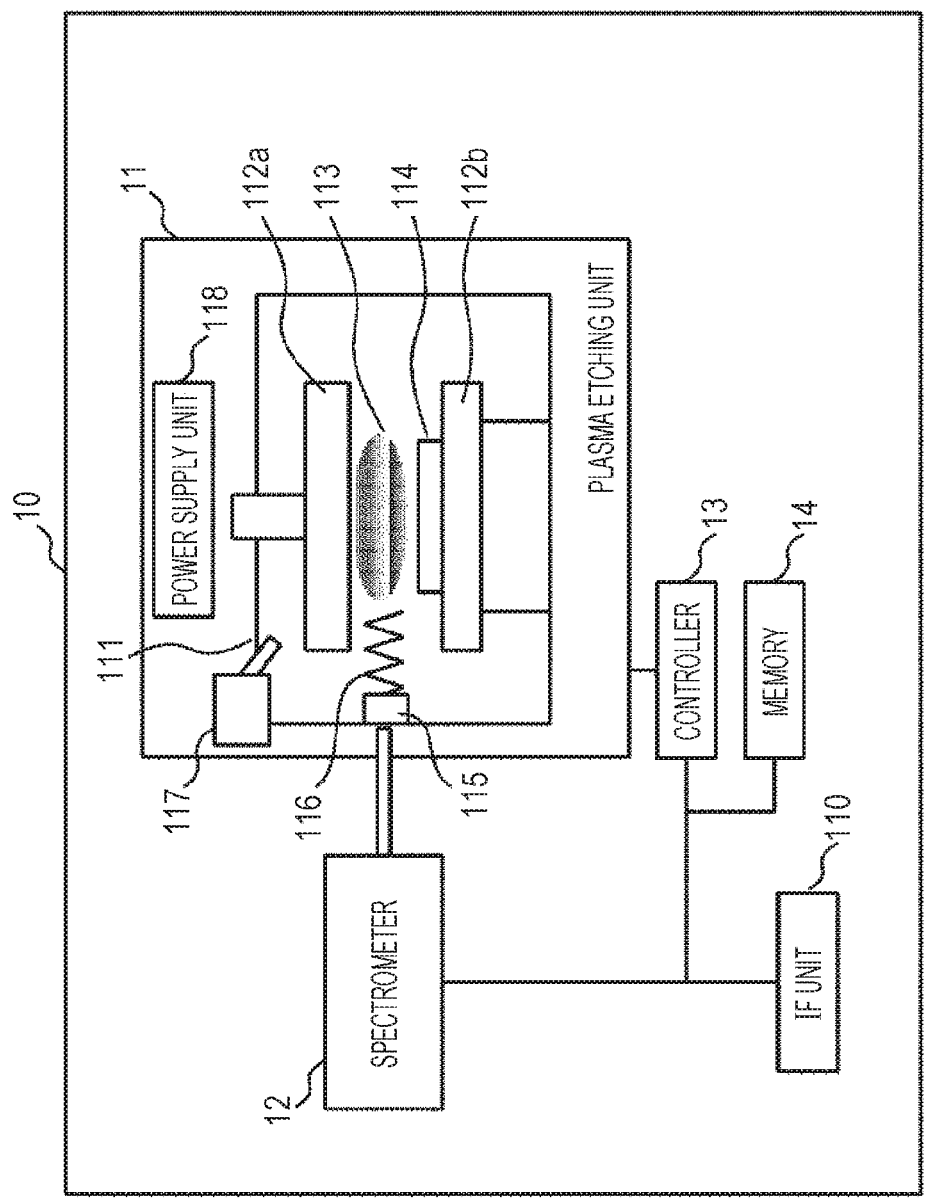
FIG. 2 is a block diagram illustrating an exemplary configuration of a plasma processing unit of the plasma processing apparatus in FIG. 1.

As illustrated in FIG. 2, the plasma etching unit 11 of the plasma processing unit 10 includes a chamber 111 evacuated through a vacuum evacuation means (not illustrated) such that the inside thereof becomes vacuum, a pair of electrodes 112a and 112b, a window 115 from which the inside of the chamber 111 is observed from the outside, and a gas supplying unit 117 that supplies, to the inside of the vacuum-evacuated chamber 111, a processed gas for carrying out the plasma processing on a wafer 114. A power supply unit 118 applies radio frequency electric power to the pair of electrodes 112a and 112b and applies radio frequency bias electric power to the electrode 112b, whereby plasma 113 is generated in the inside of the chamber 111 which has been vacuum-evacuated and supplied with the processed gas.

Specifically, when instructed by the controller 13, the plasma etching unit 11 places the wafer 114 on a sample stage within the chamber 111 and vacuum-evacuates the inside of the chamber 111. In this situation, the plasma etching unit 11 supplies the processed gas from the gas supplying unit 117 and applies the radio frequency electric power to the electrodes 112a and 112b, thereby turning the processed gas into plasma between the electrodes 112a and 112b. The wafer 114 is processed by causing the gas 113 turned into plasma to collide with the wafer 114.

The gas 113 turned into plasma contains various types of elements such as Cl and Ar contained in the processed gas supplied from the gas supplying unit 117, and Si and Al generated from the wafer 114 in the course of the processing and thus generates light 116 having wavelengths in accordance with these various types of elements contained in the gas 113 turned into plasma. The generated light 116 is measured and monitored by the spectrometer 12 through the window 115 and stored, via the IF units 110 and 210, to the OES data storage region 24 of the storage unit 22 in the analysis apparatus 20.

When the plasma processing is completed, the processed wafer 114 is taken out from the chamber 111 to be conveyed to another apparatus (measurement apparatus or the like) and another new wafer 114 is conveyed to the inside of the chamber 111 of the plasma processing unit 10 to be subjected to the plasma processing.

After the plasma processing has been carried out on several wafers, the plasma processing unit 10 carries out adjustment processing to adjust a state of the inside of the chamber 111. For example, another processed gas different from that used for the plasma processing for the wafer is supplied so as to be turned into plasma and cleaning is carried out as the adjustment processing to remove reaction products adhered to a wall surface within the chamber. Thereafter, the plasma processing is carried out on another several wafers. As described above, the plasma processing unit 10 alternately carries out the adjustment processing for the inside of the chamber 111 and the plasma processing. A group of the wafers subjected to the plasma processing between the adjustment processing and the next adjustment processing will be hereinafter referred to as lot. The analysis apparatus described later carries out the analysis processing per lot.

A method for carrying out the plasma processing by applying the radio frequency electric power to the electrodes 112a and 112b has been exemplified here. However, another method of the plasma processing such as a plasma processing method for generating plasma by introducing a microwave into the chamber may be employed.

Time Interval

A plasma processing interval and the time interval according to the first working example of the invention will be described with reference to FIG. 3A.

Figure 3A:
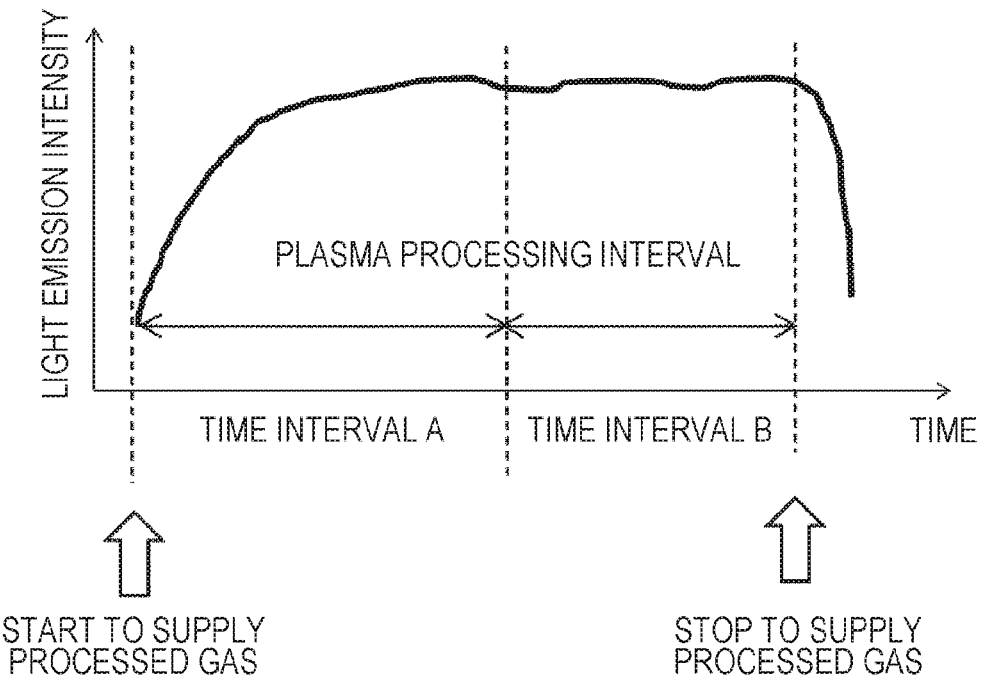
FIG. 3A is a diagram for explaining a plasma processing interval and time intervals in the first working example.

In FIG. 3A, a horizontal axis represents time, whereas a vertical axis represents the light emission intensity of plasma. In the "plasma processing interval", the wafers are processed for each lot by supplying the processed gas to the chamber and applying the radio frequency electric power to the electrodes to turn the processed gas into plasma. Once the plasma processing for the wafers in one lot is completed, supplying of the processed gas and applying of the radio frequency electric power are stopped. In the working example, a time period from a start to an end of supplying of the processed gas to the chamber is assumed as the "plasma processing interval". However, the "plasma processing interval" may be determined using other information on the plasma processing. For example, an interval in which values for an electric current are constant may be determined as the "plasma processing interval".

Additionally, in the working example, the "plasma processing interval" is divided into the plurality of "time intervals" such as "time intervals" A and B or "time intervals" A, B, and C. With this, the "time intervals" are associated with the analysis processing of the light emission intensity of plasma in the plasma processing for each wafer in each lot.

OES Data

Figure 3B:
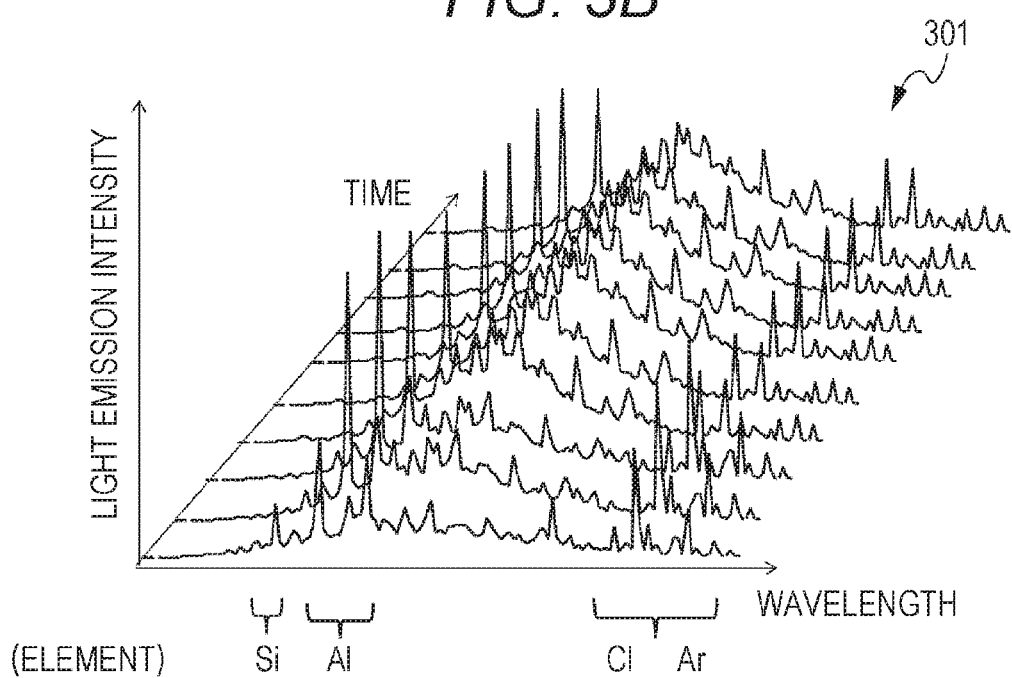
FIG. 3B is a graph for explaining an exemplary relationship among plasma emission intensity, a wavelength bandwidth, and a time period for plasma processing based on OES data.

FIG. 3B illustrates a transition over time of waveform signals 301 as an example of the OES data of plasma emission containing a great number of elements such as Si and Al measured by the spectrometer 12. FIG. 3B is a graph for explaining an exemplary relationship among plasma emission intensity, a wavelength bandwidth, and a time period for the plasma processing based on the OES data, where an X axis represents a wavelength of the light emitting from each element, a Y axis represents time, and a Z axis represents the light emission intensity of plasma. The time represented by the Y axis corresponds to, for example, "time intervals" 1 to 100 in the processing for nth wafer.

As illustrated in FIG. 3B, the wavelength bandwidth and the intensity of plasma emission vary as the time for the plasma processing elapses. The waveform signal 301 of the OES data has two-dimensional aspects, namely, the wavelength and the time and represents a value of the light emission intensity measured for each wavelength at each time point. The value of the light emission intensity individually measured for each wavelength at each time point is stored to the OES data storage region 24, described later, together with an ID of the OES data.

Analysis Apparatus

Information identifying the number of times the plasma processing has been carried out and information identifying the ID of the OES data are stored in the number-of-times of wafer processing data storage region 23 of the storage unit 22 illustrated in FIG. 1.

FIG. 4 illustrates a number-of-times of wafer processing data table 23a as an example of the number-of-times of wafer processing data storage region 23. This table has multiple fields such as a number of times of lot processing field 23b, a number of times of wafer processing per lot field 23c, a total number of times of wafer processing field 23d, and an OES data ID field 23e.

The number of times of lot processing field 23b stores information identifying the number of times of lot processing. As described earlier, the lot is a group of wafers subjected to the plasma processing between executions of the adjustment processing for adjusting a state of the inside of the chamber 111. Cleaning processing is carried out between a lot 1 and a lot 2.

The number of times of wafer processing per lot field 23c stores information identifying the number of times the wafers in the same lot have been subjected to the plasma processing.

The total number of times of wafer processing field 23d stores information identifying the number of times wafers have been subjected to the plasma processing.

The OES data ID field 23e stores information, such as p101, p102, and so forth, identifying an OES data table 24a of the OES data storage region 24 described later. For example, the OES data ID p101 indicates data, in FIGS. 3A and 3B, for the wavelength and the light emission intensity for the "time interval" 1 in the processing of a first wafer.

FIG. 5 illustrates the OES data table 24a serving as an example of the OES data storage region 24. This table has multiple fields such as an OES data ID field 24b, a wavelength field 24c, a plasma processing interval field 24d, and a light emission intensity field 24e. According to this example, the plasma processing interval is divided into 1 to 100. In this example, the number of divisions of the plasma processing interval is 100. However, this number is assumed to be added or reduced as necessary in a range appropriate for the analysis processing. The tables are prepared for the number of wafers whose OES data is measured.

The OES data ID field 24b stores information for associating the OES data table 24a with the number-of-times of wafer processing data table 23a. Values stored in the OES data ID field 24b are associated with the aforementioned values p101, p102, and so forth stored in the OES data ID field 23e of the number-of-times of wafer processing data table 23a.

The light emission intensity field 24e stores a value of the light emission intensity individually measured for each wavelength of the wavelength field 24c at each time point of the plasma processing interval field 24d.

Figure 6:
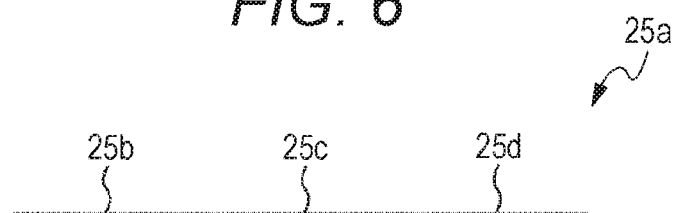
FIG. 6 is an exemplary table of wavelength ID data held in the storage unit in FIG. 1.

FIG. 6 illustrates an element wavelength data table 25a serving as an example of the element wavelength data storage region 25. This table has multiple fields such as a wavelength ID field 25b, an element field 25c, and a wavelength field 25d.

The wavelength ID field 25b stores information on the wavelength ID identifying a combination of the element and the wavelength. The element field 25c stores information identifying a candidate of the elements contained in plasma. The wavelength field 25d stores information identifying a wavelength of the light emitting from the element (in units of nanometer).

For example, two types of time-resolved emission spectra of light, namely, a wavelength of 251 nm and a wavelength of 288 nm are obtained from the same element Si and these spectra are distinguished as data of wavelength IDs 1 and 2.

FIG. 7 illustrates a correlation data table 26a serving as an example of the correlation data storage region 26. This table has multiple fields such as a wavelength ID field 26b, an element field 26c, a wavelength field 26d, a time interval field 26e, a determination coefficient average field 26f, a direction of correlation field 26g, a matching of correlation direction field 26h, a maximum determination coefficient field 26i, and an employment candidate field 26j.

Information is stored to the respective fields during the analysis processing described later.

Information identifying an element emitting a wavelength identified in the wavelength field 26d is stored to the wavelength ID field 26b and the element field 26c.

Information identifying a candidate of the wavelength used to observe or control the plasma processing is stored to the wavelength field 26d. The information stored therein is referred to as wavelength WL for the following description.

Information identifying a candidate of the time interval used to observe or control the plasma processing is stored to the time interval field 26e. In the following description, the information stored therein is referred to as time interval WLT.

In the analysis processing described later, by using the values stored in the wavelength field 26d and the time interval field 26e, processing is carried out to evaluate the degree of correlation between the number of times of wafer processing and an average value of the light emission intensity for the wavelength WL of the wavelength field 24c and the time interval WLT of the plasma processing interval field 24d in the OES data table 24a, illustrated in FIG. 6, stored in the OES data storage region 24.

Information identifying the degree of correlation between the average value of the light emission intensity and the number of times of wafer processing calculated as described above by using the values stored in the wavelength field 26d and the time interval field 26e is stored to the determination coefficient average field 26f. For example, a determination coefficient obtained by squaring a correlation coefficient is stored. A calculation method of this determination coefficient ($r^2$ or $R^2$) will be described in detail later.

Information identifying whether the average value of the light emission intensity calculated as described above by using the values stored in the wavelength field 26d and the time interval field 26e increases or decreases (whether to indicate a positive correlation or a negative correlation) in line with the number of times of wafer processing is stored to the direction of correlation field 26g. For example, a "+" sign indicating an increase is stored in the case of increasing, whereas a "−" sign indicating a decrease is stored in the case of decreasing.

Information identifying whether the information stored in the direction of correlation field 26g matches between the elements is stored to the matching of correlation direction field 26h. In this field, an identical value is stored for each type of elements stored in the element field 26c. For example, in regard to the respective wavelengths in the wavelength field 26d for which identical values are stored in the element field 26c, when all values of the information stored in the direction of correlation field 26g match to each other or a percentage of the matched values is higher than a predetermined threshold, "circle" signs are stored, and in other cases, "cross" signs are stored.

Information indicating a wavelength having a maximum value of the determination coefficient average stored in the determination coefficient average field 26f, among the wavelength IDs for which the "circle" signs indicating matching are stored in the matching of correlation direction field 26h, is stored to the maximum determination coefficient field 26i. For example, a "circle" sign is stored in a row of the maximum value.

Information indicating a wavelength whose value stored in the determination coefficient average field 26f is equal to or larger than a predetermined threshold, for example, 0.88, among the wavelength IDs for which the "circle" signs indicating matching are stored in the matching of correlation direction field 26h, is stored to the employment candidate field 26j. For example, a "double circle" sign is stored to a row of the wavelength ID having the maximum determination coefficient and "circle" signs are stored to rows of the other wavelength IDs having large determination coefficients. This is because, in a case where the wavelength ID having the maximum determination coefficient is unavailable due to some condition, there is a possibility of using a second best wavelength ID having a value exceeding the threshold.

Values of the OES data differ depending on the wavelengths of the light emitting from elements that emit light and also vary as the time elapses during the plasma processing. Accordingly, it is desirable to identify, among a massive number of combinations constituted by the wavelengths and the time intervals of a great number of elements, the optimum combination of the wavelength and the time interval used to observe or control the plasma processing.

Figure 8:
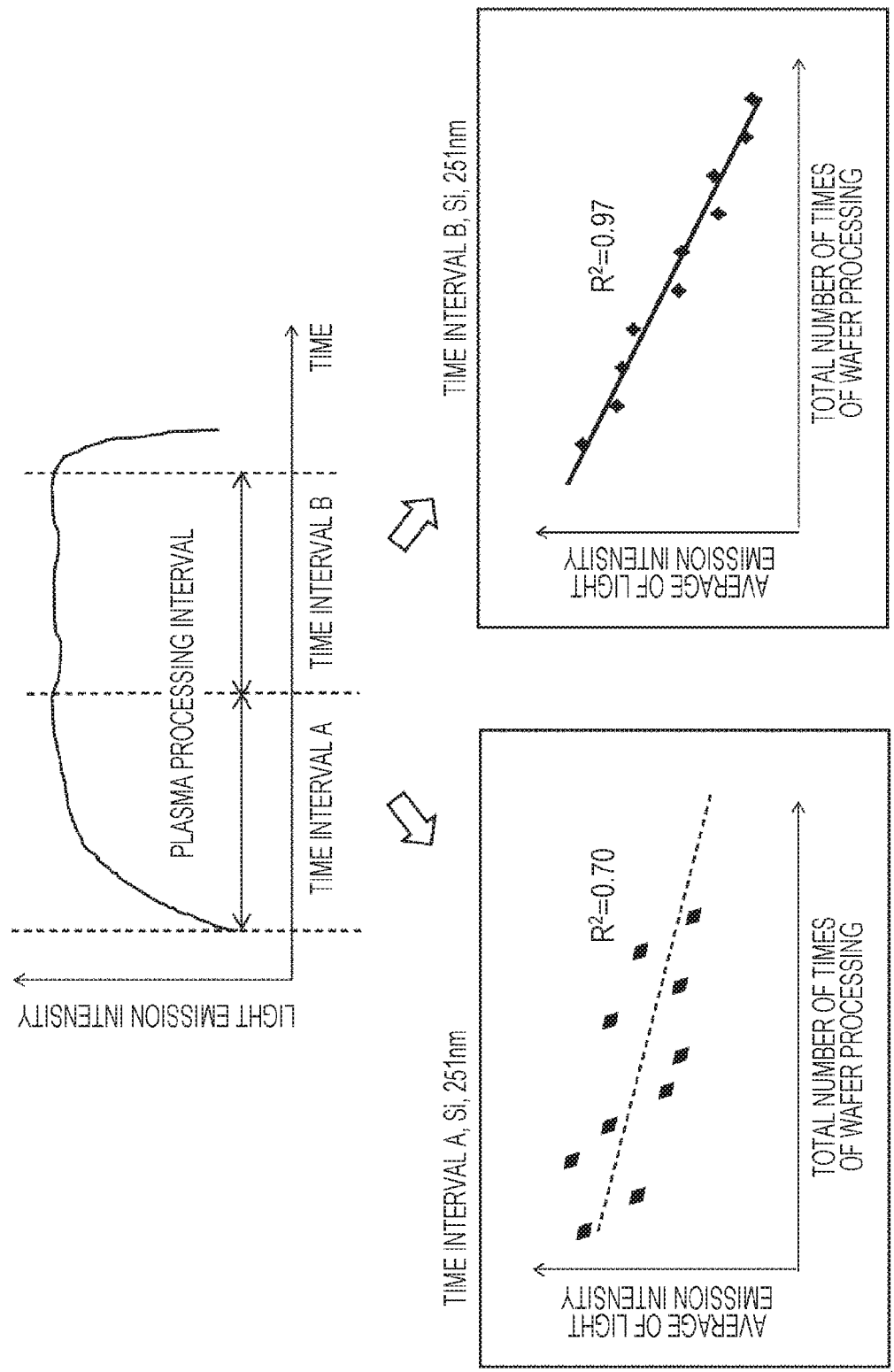
FIG. 8 is a diagram illustrating the OES data for the plurality of time intervals within the plasma processing interval and an exemplary correlation in the first working example.

FIG. 8 is a diagram illustrating the OES data for the plurality of time intervals within the plasma processing interval and an exemplary correlation according to the invention. In this example, the average value of the light emission intensity for each of the two time intervals A and B within the plasma processing interval is calculated, and the degree of correlation (determination coefficient) and the direction of correlation between the average value of the light emission intensity and the number of times of wafer processing are calculated per lot. In the combinations of the same element of Si and the same wavelength of 251 nm, the average value of the determination coefficient ($R^2$) for the time interval A is 0.70, whereas the average value of the determination coefficient for the time interval B is 0.97. The time interval B has a larger average value of the determination coefficient and this average value of the determination coefficient for the time interval B is assumed to exceed the threshold. In this case, the combination of the wavelength and the time interval for the time interval B is used to observe or control the plasma processing.

In the example in FIG. 8, when the two time intervals A and B are assumed to be integrated into a single time interval, the degree of correlation between the average value of the light emission intensity and the number of times of wafer processing for this interval is lower than that for the time interval B alone, being inappropriate for observation or control of the plasma processing.

The plasma processing interval to be subjected to the analysis processing may be divided into three or more time intervals.

Analysis Processing of Analysis Apparatus 20

The analysis processing of the analysis apparatus 20 according to the working example identifies, among the massive plasma emission data (OES data), the optimum wavelength and the optimum time interval used to observe or control the plasma processing in the plasma processing apparatus that carries out the plasma processing on a semiconductor wafer.

The analysis processing is used to determine a condition for observation or control in a case where an apparatus manager carries out the plasma processing on the plurality of wafers using a plasma processing apparatus and thereafter carries out the wafer processing of similar specifications using that plasma processing apparatus.

The analysis processing according to the working example carries out first processing of calculating, using the computing program 28, the average value of the light emission intensity among the plurality of time intervals of the plasma processing for each wavelength of the light emitting from the plurality of elements contained in plasma to calculate, per lot, the degree of correlation and the direction of correlation between the average value of the light emission intensity and the number of times of wafer processing; second processing of identifying, based on the information on the degree of correlation calculated per lot, a time interval having the maximum degree of correlation for each wavelength of the light emitting from the elements contained in the plasma; third processing of determining matching of the directions of correlation among the wavelengths of the light emitting from the elements for each of the elements contained in the plasma; and fourth processing of identifying, using the determination results of matching of the directions of correlation and the information on the degree of correlation, a combination of the wavelength and the time interval of an element which has the matched directions of correlation and the maximum degree of correlation, as a combination having a high correlation, that is, a wavelength and a time interval of an element used to observe or control the plasma processing.

Hereinafter, a flow of the analysis processing carried out in the analysis apparatus 20 according to the working example, namely, the analysis processing through the computing program 28 will be specifically described with reference to FIGS. 9 to 15B.

Figure 10:
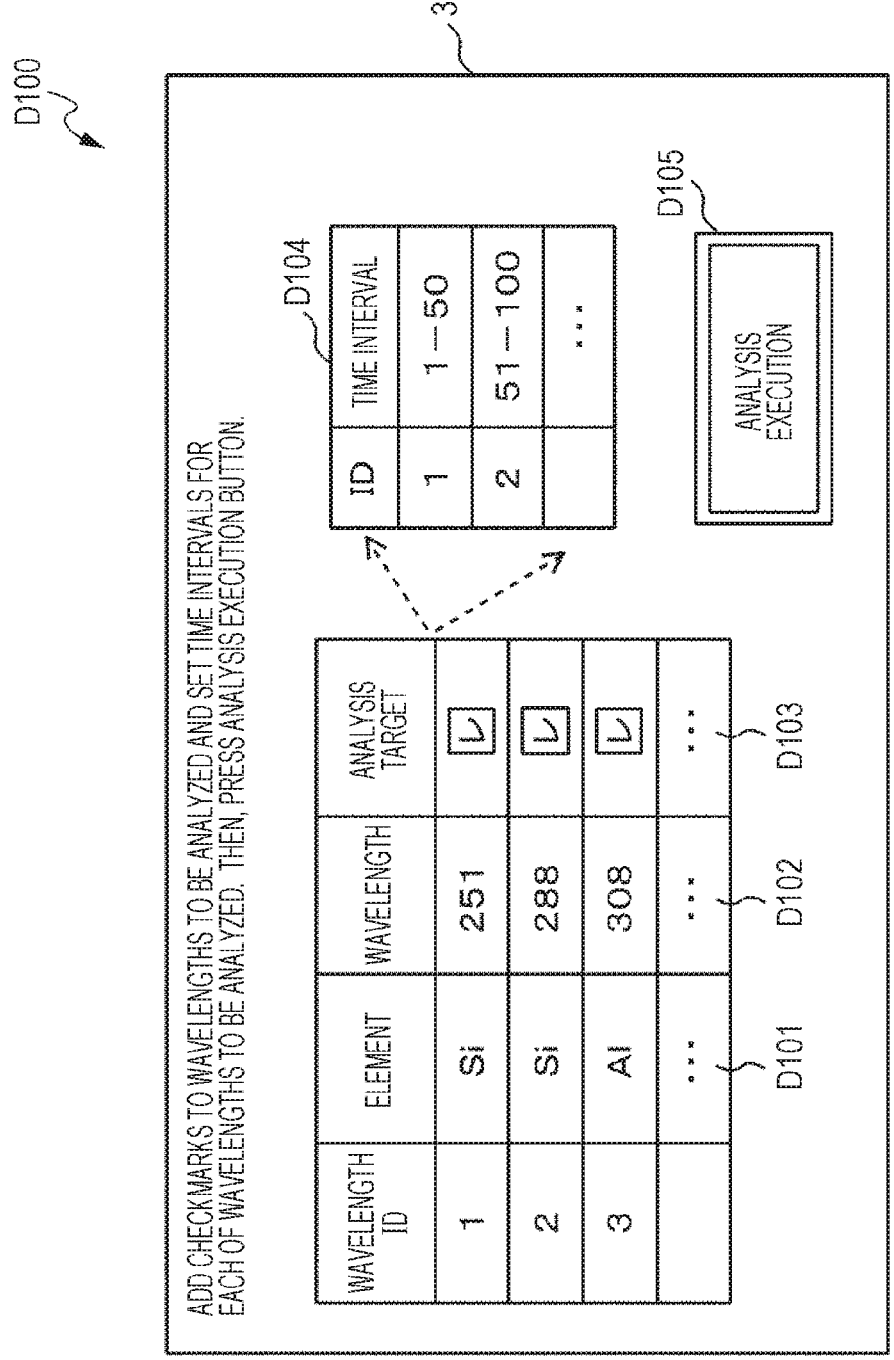
FIG. 10 is a front view illustrating a screen displaying an analysis target wavelength input unit and an analysis execution button in FIG. 1.

When the analysis apparatus 20 is started up, a display screen D100 of an input/output unit as illustrated in FIG. 10 is displayed. In order to carry out the analysis processing in the analysis apparatus 20, an operator inputs a condition for carrying out the analysis processing on the display screen D100 illustrated in FIG. 10. On the display screen D100, the information stored in the element field 25c of the element wavelength data table 25a is displayed in D101 and the information stored in the wavelength field 25d is displayed in D102 together with the wavelength IDs. The operator adds a checkmark to a wavelength to be analyzed in an analysis target field D103 on this display screen D100 to instruct on analysis execution. Specifically, on the display screen D100, the operator adds a checkmark to a wavelength ID to be analyzed in the analysis target field D103 and also inputs the plurality of time intervals defined by time IDs for each of the wavelength IDs in a time interval field D104. For example, once the operator sets the number of divisions for the time intervals, the time ID of the time interval field D104 and the corresponding time interval are automatically generated and displayed. The operator selects the time ID to input the time interval. Additionally, when the operator clicks an analysis execution button D105 to instruct on analysis execution, the analysis apparatus 20 carries out the analysis processing and outputs a combination of the wavelength and the time interval appropriate for observation or control of the plasma processing.

A configuration in which all of the wavelengths of the light emitting from the elements are automatically selected may be employed instead of one in which the operator selects the wavelengths in the analysis target field D103.

Upon starting the analysis processing, the analysis apparatus 20 stores, to the correlation data table 26a illustrated in FIG. 7, a group of the wavelengths to be analyzed which has been input through the display screen D100, that is, information on the wavelength IDs (the wavelengths and the elements thereof) and the time intervals (S101).

Next, a combination of each of the wavelength IDs to be analyzed that have been created in S101 and each of the plurality of time intervals within the plasma processing interval is created (S102). Subsequently, information indicating the degree of correlation (determination coefficient) between the number of times of wafer processing and the light emission intensity is calculated per lot for the combination of the wavelength and the time interval in each row of the correlation data table 26a (S103). In addition, information indicating the direction of correlation (simple regression coefficient) between the number of times of wafer processing and the light emission intensity is calculated per lot for the combination of the wavelength and the time interval (S104). The calculated determination coefficients are averaged among lots (S105) and the simple regression coefficients are averaged among lots (S106). This processing of calculating the averages of the determination coefficient and the simple regression coefficient among lots to determine the direction of correlation is carried out for all of the time intervals (S107). Subsequently, a time interval having a highest correlation (a time interval having a maximum determination coefficient) is identified for the wavelengths to be analyzed and stored to the correlation data table 26a (S108).

By carrying out this processing from S102 to S108 on all of the wavelengths to be analyzed, a time interval having a maximum determination coefficient is identified (S109). In addition, a value of the determination coefficient and the direction of correlation for this time interval is stored to the correlation data table 26a.

Next, by using the calculated direction of correlation, the directions of correlation for the wavelengths of the light emitting from the elements are compared per element and matching of the directions of correlation (positive or negative) is determined (S110). In regard to the elements whose directions of correlation match to each other, a combination of the wavelength and the time interval having the highest correlation, namely, the maximum determination coefficient is presented (S111).

Subsequently, when instructed by the operator, the time interval for the presented wavelength is set to smaller divisions and the correlation is calculated to carry out the detailed analysis (S112). Results of carrying out the detailed analysis are then stored to a detailed analysis data table 27a (S113) and results of the detailed analysis are displayed (S114). Thereafter, the processing is terminated. In a case where the detailed analysis is not carried out, the combination of the wavelength and the time interval having the maximum determination coefficient obtained in (S111) is stored to the detailed analysis data table 27a. Thereafter, the processing is terminated.

Figure 9:
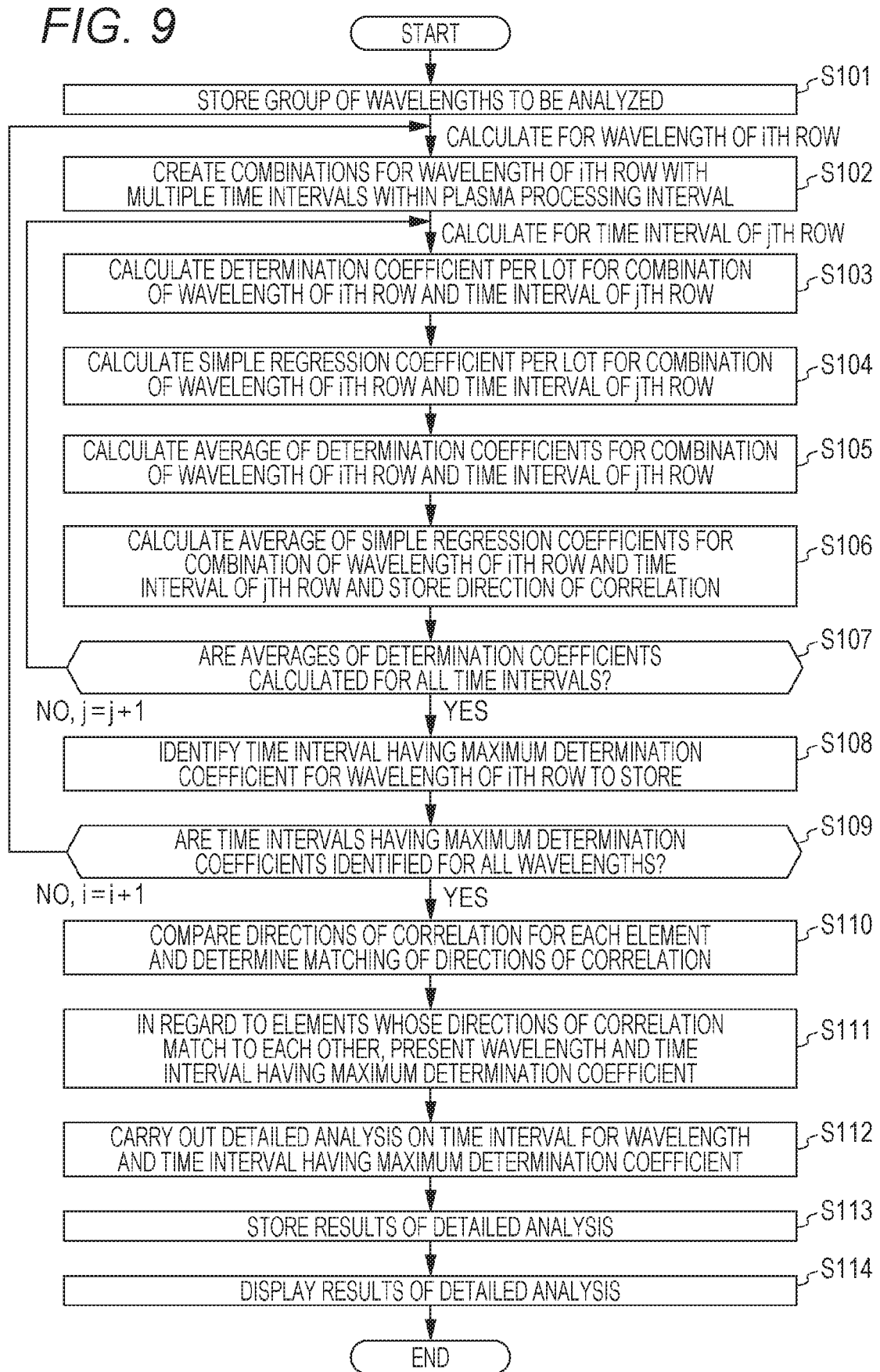
FIG. 9 is a flowchart illustrating analysis processing by a computing unit of the data analysis apparatus in the first working example.

Hereinafter, details of each processing in FIG. 9 will be described step by step.

(S101): in S101, the computing unit 21 stores, to the element field 26c and the wavelength field 26d of the correlation data table 26a, the wavelengths in D102 to which checkmarks have been added in the analysis target field D103 on the display screen D100 illustrated in FIG. 10 and the corresponding elements in D101, respectively.

From S102 to S109, the wavelength and the element stored in each row of the correlation data table 26a are processed. In the description, a row to be processed is referred to as ith row (i=1, 2, . . . ), whereas a wavelength to be processed is referred to as wavelength of the ith row. The processing is sequentially carried out from the first row.

(S102): the computing unit 21 creates the plurality of combinations for the element and the wavelength of the ith row using the specified time intervals to store information to each of a wavelength ID field 210b, an element field 210c, a wavelength field 210d, and a time interval field 210e of the intermediate data table 210a described later.

FIG. 11 illustrates the intermediate data table 210a used for calculation from S102 to S108. The intermediate data table 210a has multiple fields such as the wavelength ID field 210b, the element field 210c, the wavelength field 210d, the time interval field 210e, a determination coefficient per lot field 210f, a determination coefficient average field 210g, a maximum determination coefficient average field 210h, a regression equation slope per lot field 210i, a slope average field 210j, and a direction of correlation field 210k.

Values are stored to the respective fields during the analysis processing from S102 to S109.

In S102, the computing unit 21 stores the element and the wavelength of the ith row to the element field 210c and the wavelength field 210d, respectively, and also stores, to each row of the time interval field 210e, a predetermined candidate of the time interval specifying the time period of the plasma processing. For example, time intervals indicating a first half and a second half of the plasma processing are stored (1-50 and 51-100 in FIG. 11). In each processing from S103 to S107, the time interval stored in each row of the intermediate data table 210a is processed. In the description, a row to be processed is referred to as jth row (j=1, 2, . . . ), whereas a time interval to be processed is referred to as time interval of the jth row. The processing is sequentially carried out from the first row.

(S103): in regard to the combination of the wavelength of the ith row and the time interval of the jth row, the computing unit 21 calculates the determination coefficient which is a value indicating the degree of correlation per lot. The computing unit 21 calculates the correlation coefficient between the number of times of wafer processing per lot and the light emission intensity for each value in the number of times of lot processing field 23b of the number-of-times of wafer processing data table 23a to store the determination coefficient obtained by squaring the correlation coefficient to the determination coefficient per lot field 210f. The average value of the light emission intensity corresponding to the combination of the wavelength of the ith row and the time interval of the jth row in the OES data table 24a identified by the value stored in the OES data ID field 23e is used as a value of the light emission intensity. A value obtained by dividing the average value of the light emission intensity corresponding to the combination of the wavelength of the ith row and the time interval of the jth row by the light emission intensity of another wavelength may be used as the average value of the light emission intensity.

The computing unit 21 stores a value $r^2$ (or $R^2$) calculated using, for example, the following formulas (1) to (4) to the determination coefficient average field 210g.

[Mathematical Formula 1]

$$X_{11} = \sum x_i^2 - \frac{(\sum x_i)^2}{n} \quad (1)$$

[Mathematical Formula 2]

$$X_{12} = \sum y_i^2 - \frac{(\sum y_i)^2}{n} \quad (2)$$

[Mathematical Formula 3]

$$X_{13} = \sum x_i y_i - \frac{(\sum x_i)(\sum y_i)}{n} \quad (3)$$

[Mathematical Formula 4]

$$r^2 = \frac{x_{13}^2}{x_{11} x_{12}} \quad (4)$$

In the formulas above, $x_i$ represents the value stored in the number of times of wafer processing per lot field 23c of the number-of-times of wafer processing data table 23a. $y_i$ represents the average value of the light emission intensity corresponding to the combination of the wavelength of the ith row and the time interval of the jth row in the OES data table 24a identified by the value stored in the OES data ID field 23e. n represents the number of items of the data (the number of columns) in the number of times of wafer processing per lot field 23c and the OES data ID field 23e for a value of the number of times of lot processing field 23b currently being calculated. A sign $\Sigma$ indicates that all of the data in the number of times of lot processing field 23b currently being calculated is to be calculated.

In the example in FIG. 8 described earlier, the determination coefficient $R^2$ for the time interval A is 0.70, whereas the determination coefficient $R^2$ for the time interval B is 0.97, which indicates that the time interval B with a larger determination coefficient $R^2$ has a higher correlation between the number of times of wafer processing and the light emission intensity than the time interval A. Accordingly, it is desirable to remove the time interval A from the plasma processing interval and use the correlation data for the time interval B alone to observe or control the plasma processing.

A value of the determination coefficient by the number of times of wafer processing per lot and the light emission intensity may be calculated by, instead of the square of the correlation coefficient, a square error of a quadratic function or a cubic function where the number of times of wafer processing per lot serves as an explanatory variable and the light emission intensity serves as an objective variable.

In addition, $x_i$ and $y_i$ may be reversed for calculation. Specifically, the value stored in the number of times of wafer processing per lot field 23c of the number-of-times of wafer processing data table 23a may be used as $y_i$, while the average value of the light emission intensity corresponding to the combination of the wavelength of the ith row and the time interval of the jth row in the OES data table 24a identified by the value stored in the OES data ID field 23e may be used as $x_i$.

Furthermore, instead of the number of times of wafer processing per lot, a value of the total number of times of wafer processing may be used.

(S104): in regard to the combination of the wavelength of the ith row and the time interval of the jth row, the computing unit 21 calculates a slope of a regression equation which is a value indicating the direction of correlation per lot.

As in the processing in S103, the computing unit 21 creates, for each value of the number of times of lot processing field 23b of the number-of-times of wafer processing data table 23a, a regression equation of simple regression where the number of times of wafer processing per lot serves as an explanatory variable and the light emission intensity serves as an objective variable and stores a primary coefficient (a coefficient indicating a slope) to the regression equation slope per lot field 210i. As in S103, the average value of the light emission intensity corresponding to the combination of the wavelength of the ith row and the time interval of the jth row in the OES data table 24a identified by the value stored in the OES data ID field 23e is used as a value of the light emission intensity.

The computing unit 21 stores a value $a_1$ calculated using the aforementioned formulas (1) and (3) and the following formula (5) to the regression equation slope average field 210j.

[Mathematical Formula 5]

$$a_1 = \frac{x_{13}}{x_{11}} \quad (5)$$

Figure 12:
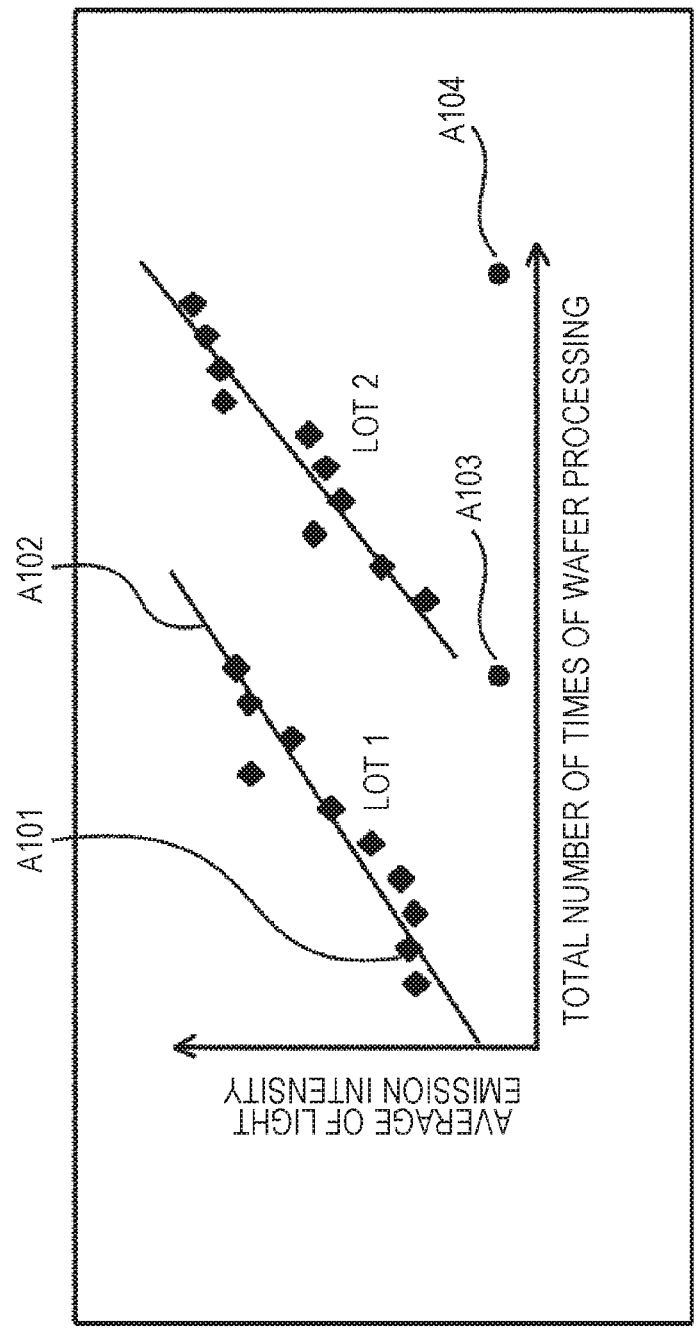
FIG. 12 is a scatter diagram for explaining calculation processing for a direction of correlation in the analysis processing in FIG. 9 and illustrating a relationship between the total number of times of wafer processing and an average of the light emission intensity.

FIG. 12 illustrates a schematic diagram of the regression equations obtained per lot. FIG. 12 is a scatter diagram where the total number of processed wafers and the average of the light emission intensity serve as axes and A101 represents points for plotting values of the total number of times of wafer processing and the average of the light emission intensity. A102 is a straight line where a square sum of a distance from each point in each lot becomes a minimum value. The regression equation for A102 is created for each lot and a value of the slop is stored to the regression equation slope per lot field 210i. A103 and A104 represent cleaning or aging. Data of the average of the light emission intensity corresponding to the wavelength IDs as illustrated in FIG. 12 may be acquired also during cleaning or aging to be used for control or observation. In addition, similar calculation may be carried out during asking processing.

(S105): in regard to the combination of the wavelength of the ith row and the time interval of the jth row, the computing unit 21 calculates the average value of the determination coefficients. Specifically, the average value among the values stored in the jth row of the determination coefficient per lot field 210f in the intermediate data table 210a is calculated to be stored to the jth row of the determination coefficient average field 210g.

(S106): in regard to the combination of the wavelength of the ith row and the time interval of the jth row, the computing unit 21 calculates the average value of the slopes of the regression equations. Specifically, the average value among the values stored in the jth row of the regression equation slope per lot field 210i in the intermediate data table 210a is calculated to be stored to the jth row of the slope average field 210j. In addition, when a value of the slope average field 210j is positive, the correlation is assumed to be positive, in other words, the average value of the light emission intensity increases as the number of times of wafer processing per lot increases, and then a "+" sign is stored to the jth row of the direction of correlation field 210k. When a value of the slope average field 210j is negative, the correlation is assumed to be negative, in other words, the average value of the light emission intensity decreases as the number of times of wafer processing per lot increases, and then a "−" sign is stored to the jth row of the direction of correlation field 210*k*.

(S107): in a case where the processing of calculating the average of the determination coefficients is completed for all rows of the intermediate data table 210*a*, the computing unit 21 proceeds to subsequent processing S108. In a case where the processing is not completed for all rows, the computing unit 21 returns to processing S103 by assuming j=j+1.

(S108): in a case where the processing of calculating the average of the determination coefficients is completed for all rows of the intermediate data table 210*a*, the computing unit 21 carries out processing S108.

The computing unit 21 identifies, among the rows of the determination coefficient average field 210*g*, a row with a maximum average of the determination coefficients that has been stored and inputs a "circle" sign in a corresponding row of the maximum determination coefficient average field 210*h*. In addition, a value stored in the corresponding row of the time interval field 210*e* of the intermediate data table 210*a* is stored to the ith row of the time interval field 26*e* of the correlation data table 26*a*. Likewise, a value stored in the corresponding row of the determination coefficient average field 210*g* is stored to the ith row of the determination coefficient average field 26*f* and a value stored in the corresponding row of the direction of correlation field 210*k* is stored to the ith row of the direction of correlation field 26*g*.

(S109): in a case where the processing of calculating the average of the determination coefficients is completed for all rows (all wavelengths) of the correlation data table 26*a*, the computing unit 21 proceeds to subsequent processing S110. In a case where the processing is not completed for all rows, the computing unit 21 returns to processing S102 by assuming i=i+1.

(S110): in a case where the processing of calculating the average of the determination coefficients is completed for all rows of the correlation data table 26*a*, the computing unit 21 carries out processing S110.

The computing unit 21 compares the directions of correlation in the wavelengths indicating light emission from the elements for each of the elements stored in the element field 26*c* of the correlation data table 26*a*. Specifically, in regard to the wavelengths for which identical elements are stored in the element field 26*c*, in a case where all values of the information stored in the direction of correlation field 26*g* match to each other, the computing unit 21 stores "circle" signs indicating matching to rows of the corresponding element in the matching of correlation direction field 26*h*. In a case where all values do not match to each other, the computing unit 21 stores "cross" signs indicating non-matching. When all of the directions of correlation do not match to each other in the wavelengths which have an identical element, a case where the directions of correlation match to each other at a percentage equal to or larger than a predetermined threshold may be determined as matching. This evaluation for matching of the directions of correlation per element is carried out for all types of elements stored in the element field 26*c*.

When the directions of correlation match to each other in the respective wavelengths indicating light emission from the elements, it can be considered that an increase or a decrease in the elements within the chamber 111 leads to an increase or a decrease in the light emission intensity of the respective wavelengths. By monitoring the light emission of the wavelengths for which influence of an increase or a decrease in the elements within the chamber 111 is observed, cleaning of the apparatus or adjustment of a supply amount of gas can be properly carried out in accordance with the states of the elements constituting plasma. Accordingly, as described above, the wavelengths of the elements whose directions of correlation match to each other among the wavelengths of the light emitting from the elements can be considered appropriate for observation or control of the apparatus.

(S111): the computing unit 21 identifies a wavelength having the maximum determination coefficient among the wavelengths of the elements whose directions of correlation match to each other to display for the operator.

In the correlation data table 26*a*, the computing unit 21 identifies a row (that is, a combination of the wavelength and the time interval) having a largest value of the determination coefficient average field 26*f* among the rows having "circle" signs indicating matching in the matching of correlation direction field 26*h* and inputs a "circle" sign indicating the maximum determination coefficient in the corresponding row of the maximum determination coefficient field 26*i*.

Furthermore, the computing unit 21 displays, for the operator, information on the wavelength, the time interval, and the element having the maximum determination coefficient.

Figure 13:
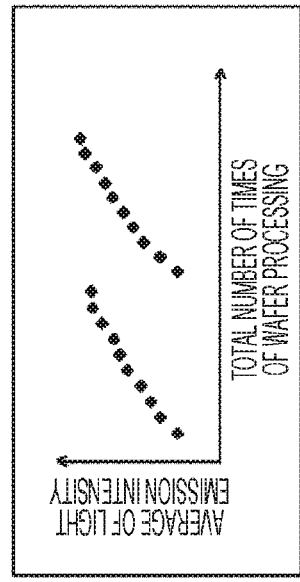
FIG. 13 is a front view illustrating a screen displaying analysis results by the data analysis apparatus on an output unit in FIG. 1.

The information on each of the wavelength, the time interval, and the element having the maximum determination coefficient in the correlation data table 26*a* is displayed on an output screen D200 illustrated in FIG. 13.

The wavelength ID is displayed in the wavelength ID field, while the element of the wavelength having the maximum determination coefficient among the wavelengths of the elements whose directions of correlation match to each other in the correlation data table 26*a* is displayed in an element field D201. That is, the information on the element in the row with a "circle" sign stored in the maximum determination coefficient field 26*i* is displayed. Hereinafter, an element in the row with a "circle" sign stored in the maximum determination coefficient field 26*i* is referred to as element of interest. In addition, a row (rows) whose element field 26*c* stores the element of interest is referred to as row(s) of the element of interest.

A wavelength field D202 displays information stored in the row of the element of interest in the wavelength field 26*d* of the correlation data table 26*a*. A time interval field D203 displays information stored in the row of the element of interest in the time interval field 26*e* of the correlation data table 26*a*. A determination coefficient average field D204 displays information stored in the row of the element of interest in the determination coefficient average field 26*f* of the correlation data table 26*a*. A direction of correlation field D205 displays information stored in the row of the element of interest in the direction of correlation field 26*g* of the correlation data table 26*a*. A matching of correlation direction field D206 displays information stored in the row of the element of interest in the matching of correlation direction field 26*h* of the correlation data table 26*a*. A maximum determination coefficient field D207 displays information stored in the row of the element of interest in the maximum determination coefficient field 26*i* of the correlation data table 26*a*.

Additionally, D208 displays a scatter diagram plotting the average values of the light emission intensity and the total number of times of wafer processing for the combination of the wavelength and the time interval having the maximum determination coefficient.

The operator can quickly recognize, from the displays from D201 to D208, the combination of the wavelength and the time interval of plasma emission varying over time in accordance with the number of times of wafer processing and the element of which the light emission varies over time. The operator sets a threshold for the average of the light emission intensity for the combination of the wavelength and the time interval identified there to observe the plasma processing, thereby maintaining the plasma processing stable. Furthermore, by adjusting an amount of the gas 113 depending on a difference between the average of the light emission intensity and a desired value (light emission target value), the plasma processing can be maintained stable.

D209 displays a screen for confirming whether to execute the detailed analysis of the time interval. The operator presses a Yes button indicated in D210 to more finely analyze the time interval for the combination of the wavelength and the time interval having the maximum determination coefficient, or presses a No button indicated in D211 to stop the analysis. When the Yes button D210 is pressed, the computing unit 21 proceeds to the processing in S112 and observes the selected combination when a Yes button D213 is pressed. On the other hand, when a No button D214 is pressed, the observation is skipped and data for the combination of the wavelength and the time interval having the maximum determination coefficient, which is displayed in D208, is stored to the detailed analysis data table 27a of the detailed analysis data storage region 27, thereafter, the processing is terminated.

(S112): when the Yes button D213 is pressed, the computing unit 21 carries out the processing for analyzing the time interval in detail for the combination of the wavelength and the time interval having the maximum determination coefficient. The computing unit 21 creates possible combinations for the time interval to store to a time interval field 211e of a detailed processing intermediate data table 211a. The detailed processing intermediate data table 211a illustrated in FIG. 14 is a data table used for the detailed analysis of the time interval and has multiple fields such as a wavelength ID field 211b, an element field 211c, a wavelength field 211d, the time interval field 211e, a determination coefficient per lot field 211f, a determination coefficient average field 211g, and a maximum determination coefficient average field 211h.

The computing unit 21 stores information on the element and the wavelength having the maximum determination coefficient to the correlation data table 26a for the maximum determination coefficient. Specifically, among values from the element field 26c and the wavelength field 26d, values stored in a row with a "circle" sign in the maximum determination coefficient field 26i are stored.

As described above, the computing unit 21 stores possible combinations for the time interval to the time interval field 211e.

As in the processing in S103, the computing unit 21 also stores, to the determination coefficient per lot field 211f, the determination coefficient by the average value of the light emission intensity and the number of times of wafer processing per lot for each of the combinations of the wavelengths and the time intervals stored in the respective rows.

The computing unit 21 also stores the average value, for each row, of values stored in the determination coefficient per lot field 211f to the corresponding row of the determination coefficient average field 211g.

In addition, the computing unit 21 identifies a row storing a maximum value among values stored in the determination coefficient average field 211g and stores a "circle" sign indicating the maximum value to the corresponding row of the maximum determination coefficient average field 211h.

The OES data sometimes includes a time interval in which the light emission intensity varies due to a disturbance. However, as described above, by variously evaluating the time intervals and identifying a combination of the wavelength and the time interval having a high correlation (a larger determination coefficient), the computing unit 21 can exclude the time interval in which the light emission intensity varies due to a disturbance. Variation in the light emission intensity due to a disturbance is a cause of errors in observation or control. Accordingly, when the time interval in which the OES data varies due to a disturbance is removed, the combination of the wavelength and the time interval appropriate for observation or control can be more accurately identified. The time interval analyzed in detail is of course set to a predetermined length or longer relative to an entire length of the plasma processing interval, for example, one-tenth or more thereof.

(S113): the computing unit 21 stores results of the detailed analysis to the detailed analysis data table 27a of the detailed analysis data storage region 27. FIG. 15B is an example of the detailed analysis data table 27a to which results of the analysis processing are recorded. This table has multiple fields such as a wavelength ID field 27b, an element field 27c, a wavelength field 27d, a time interval field 27e, and a determination coefficient average field 27g. Information is stored to the respective fields during the analysis processing.

Information identifying a candidate of the wavelength used to observe or control the plasma processing is stored to the wavelength field 27d. Information identifying a candidate of the time interval used to observe or control the plasma processing is stored to the time interval field 27e.

The values stored in the wavelength field 27d and the time interval field 27e represent the wavelength and the time interval of light emission, respectively, used when the correlation with the number of times of wafer processing is calculated.

Information identifying the degree of correlation between the average value of the light emission intensity and the number of times of wafer processing calculated by using the values stored in the wavelength field 27d and the time interval field 27e is stored to the determination coefficient average field 27g. For example, a determination coefficient obtained by squaring a correlation coefficient $r^2$ (or $R^2$) is stored.

Specifically, the computing unit 21 stores the information stored in the element field 211c and the wavelength field 211d of the detailed processing intermediate data table 211a to the element field 27c and the wavelength field 27d of the detailed analysis data table 27a, respectively.

The computing unit 21 also stores, to the time interval field 27e and the determination coefficient average field 27g of the detailed analysis data table 27a, the information from the time interval field 211e and the determination coefficient average field 211g of the detailed processing intermediate data table 211a, respectively, stored in a row having a maximum value among the information (determination coefficients) stored in the maximum determination coefficient average field 211h.

(S114): the computing unit 21 displays results of the detailed analysis for the operator.

Figure 15A:
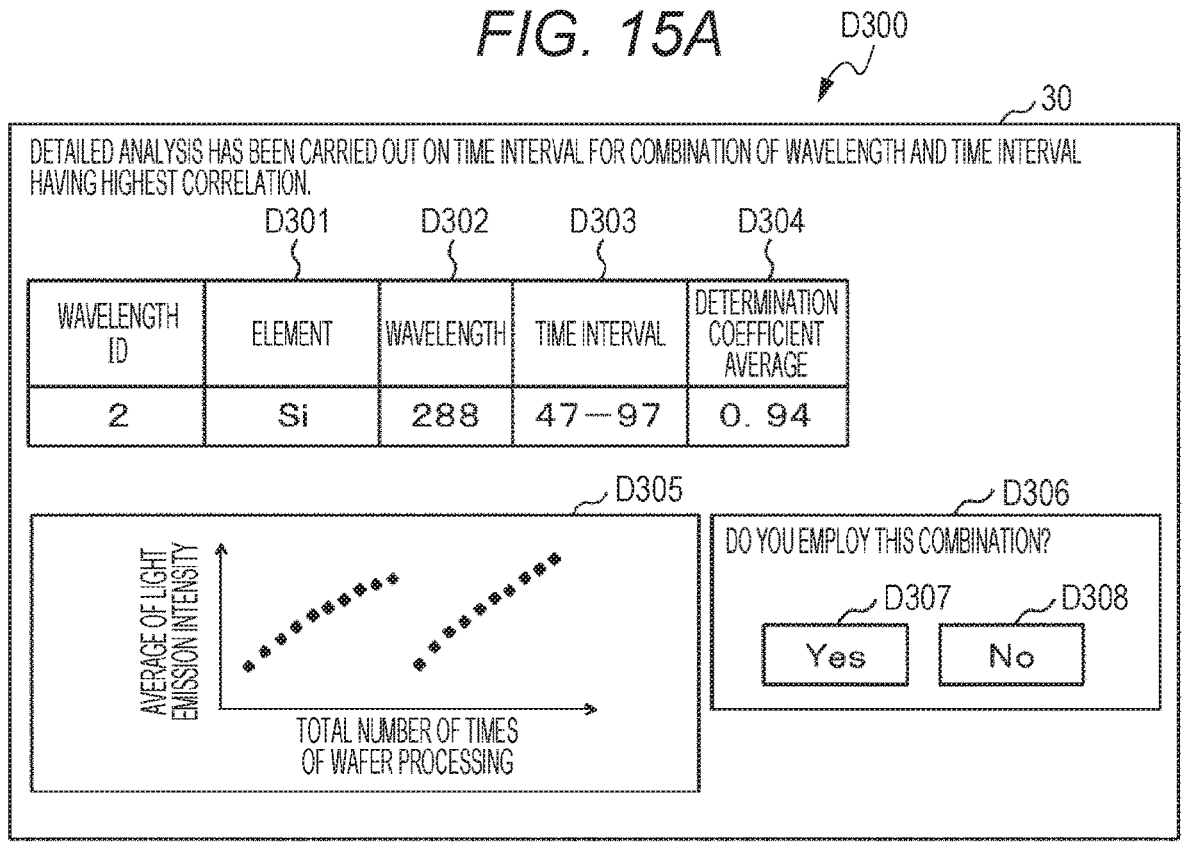
FIG. 15A is a front view illustrating a screen displaying results of the detailed analysis processing by the data analysis apparatus on the output unit in FIG. 1.
Figure 15B:
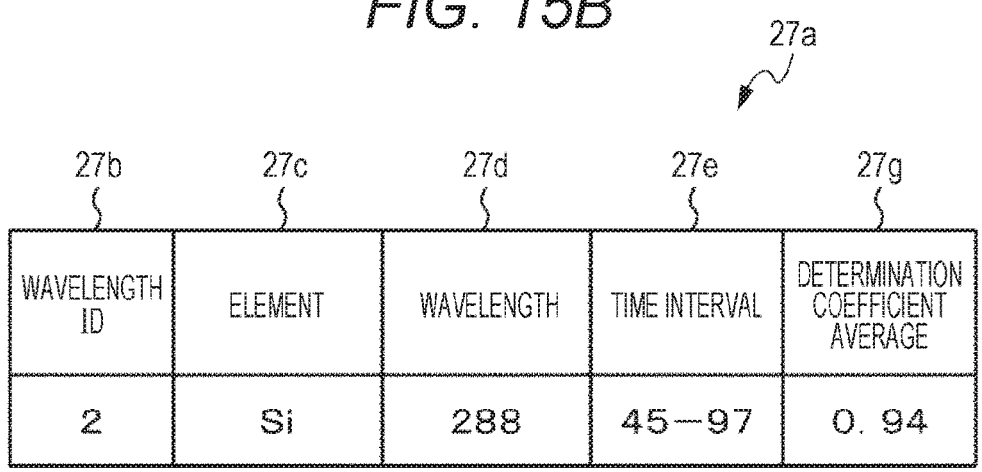
FIG. 15B is an exemplary table of detailed analysis data held in the storage unit in FIG. 1 as a result of the analysis processing.

An output screen D300 illustrated in FIG. 15A displays information on the wavelength ID of 2 having the maximum determination coefficient, namely, each of the element, the wavelength, the time intervals 47-97, and the average of the determination coefficients stored in the detailed analysis data table 27a.

A wavelength ID field, an element field D301, a wavelength field D302, a time interval field D303, and a determination coefficient average field D304 display information stored in the wavelength ID field 27b, the element field 27c, the wavelength field 27d, the time interval field 27e, and the determination coefficient average field 27g of the detailed analysis data table 27a, respectively.

Additionally, D305 displays a scatter diagram plotting the average values of the light emission intensity and the total number of times of wafer processing for the combination of the wavelength and the time interval having the maximum determination coefficient. D306 to D308 display input buttons with which the operator can determine whether to employ the combination displayed in the scatter diagram, specifically, the combination of the wavelength ID of 2 and the time intervals 47-97 here. Whether to employ is determined by the operator because it is desirable in some cases not to employ the combination with the time intervals 47-97 due to, for example, information not given to the analysis apparatus 20. When the operator employs the combination displayed on the screen in FIG. 15A, the information thereof is recorded to the detailed analysis data table 27a in FIG. 15B. When the operator does not employ this combination, another combination having the maximum determination coefficient, for example, the combination of the wavelength ID of 2 and the time intervals 51-100 illustrated in FIG. 13 is recorded to the detailed analysis data table 27a in FIG. 15B.

By confirming the output screen D300 illustrated in FIG. 15A, the operator can recognize the optimum combination of the wavelength and the time interval of plasma emission varying over time in accordance with the number of times of wafer processing to determine whether to employ that combination for observation or control. Furthermore, the time interval in which the light emission intensity varies due to a disturbance is excluded through the detailed analysis. Therefore, the combination of the wavelength and the time interval appropriate for observation or control can be more accurately identified.

As described thus far, by using the data analysis processing carried out by the analysis apparatus of the plasma processing apparatus according to the embodiment, the wavelength and the time interval indicating variations over time occurring when the plasma processing is repeated can be quickly recognized, from among the combinations of the wavelengths and the time intervals, as the wavelength and the time interval used to observe or control the plasma processing.

Second Working Example

Next, a second working example according to the invention will be described with reference to FIG. 16. In the working example, the plurality of "time intervals" is set in a "stable interval" within the "plasma processing interval" to be subjected to the data analysis processing. Configurations other than an analysis apparatus of a plasma processing apparatus 1 and the method of the data analysis processing are similar to those in the first working example and thus the description thereof will be omitted.

At a starting point of the "plasma processing interval", the wafers are processed for each lot by supplying the processed gas to a chamber and applying the radio frequency electric power between electrodes to turn the processed gas into plasma. Once the plasma processing for the wafers is completed, supplying of the processed gas and applying of the radio frequency electric power are stopped. Even in the "plasma processing interval", the light emission intensity of plasma considerably changes (rapidly increases) in a start-up interval. Thereafter, supplying of the processed gas and the radio frequency electric power, in other words, the light emission intensity of plasma enters a stable state and becomes substantially flat. In the working example, an interval in which a state of the electric power or the gas supplied to the chamber is substantially constant, that is, a state of the light emission intensity of plasma is stable is defined as the "stable interval". Additionally, the "stable interval" is divided into the plurality of "time intervals" such as time intervals A, B, and C, and these time intervals obtained by dividing the "stable interval" are to be subjected to the data analysis processing. With this, the wafer processing per lot and the "time intervals" are associated with the analysis processing of the light emission intensity of plasma.

In the second working example, a configuration of an OES data table 24a of an OES data storage region 24 is slightly different from the configuration illustrated in FIG. 5 in the first working example. Specifically, the plasma processing interval field 24d of the table illustrated in FIG. 5 is changed to the "stable interval" and, for example, the number of divisions of this "stable interval" is 100. Accordingly, time intervals 1 to 100 in this "stable interval" are to be entered, by the operator, in the time intervals on the display screen D100 illustrated in FIG. 10 such as the time intervals A, B, and C. As in the first working example, when the operator clicks an analysis execution button D105 to instruct on analysis execution, an analysis apparatus 20 carries out the analysis processing and outputs a combination of the wavelength and the time interval appropriate for observation or control of the plasma processing.

The "start-up interval" is determined to enter the "stable interval" by the analysis apparatus based on, for example, changes in monitor values of the light emission intensity or fluctuations in electrical parameters of a plasma power supply. Unlike the first working example, a means for detecting and determining a shift to the "stable interval" is required. However, the plurality of "time intervals" is set within the "stable interval", whereby a combination of the wavelength ID and the time interval having a higher correlation can be recognized in an interval with few disturbances. As in the first working example, by using data for the combinations obtained in the analysis apparatus to observe or control the plasma processing, stable plasma processing or observation can be achieved.

A method for carrying out the plasma processing by applying the radio frequency electric power to the electrodes has been exemplified here. However, another method of the plasma processing such as a plasma processing method for generating plasma by introducing a microwave into the chamber may be employed.

Third Working Example

Next, a third working example according to the invention will be described with reference to FIGS. 17A and 17B. In the working example, based on the analysis data for the combination of the wavelength ID and the time interval having a higher correlation obtained in the first or second working example, the plasma processing or observation of a wafer is carried out by a plasma processing apparatus.

Figure 17A:
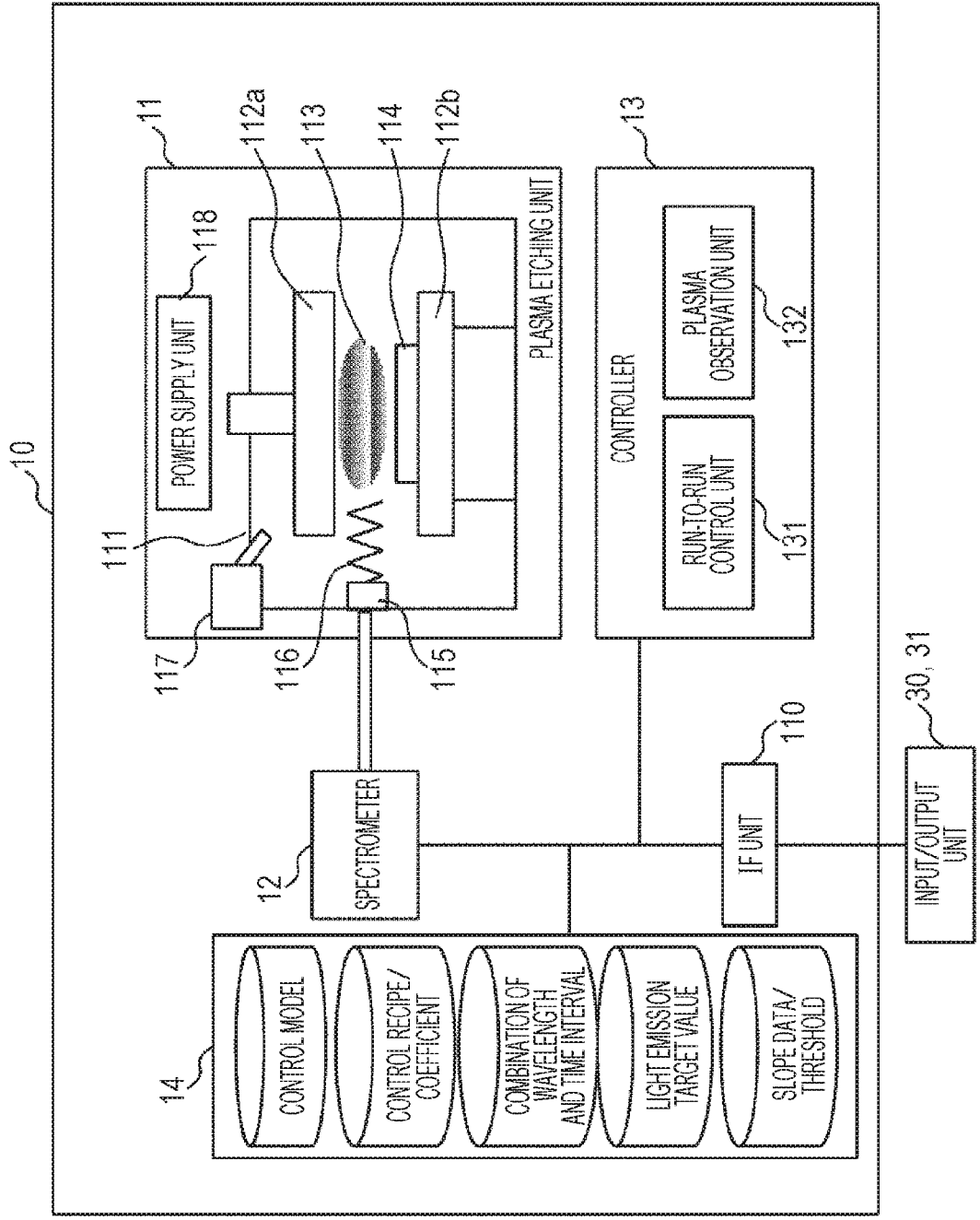
FIG. 17A is a block diagram illustrating a configuration of a plasma processing apparatus according to a third working example of the invention.

FIG. 17A is a block diagram illustrating a configuration of the plasma processing apparatus including a run-to-run control unit according to a third working example. Note that details of the run-to-run control unit will be quoted from the description in JP-5596832-B2.

A controller 13 includes the run-to-run control unit 131 and a plasma observation unit 132 to carry out the plasma processing. A memory/database 14 holds information such as data for a control model, data for a control recipe and a coefficient, data for a combination of the wavelength ID and the time interval in a detailed analysis data table 27a (FIG. 15B), a light emission target value, data for a slope of a regression equation per lot (the average of the determination coefficients in FIG. 15B) and a threshold. A spectrometer 12 functions as a process monitor for observing a state of the light emission of plasma, whereas a gas supplying unit (mass flow controller) 117 and a power supply unit (a radio frequency power supply for plasma generation and a sample stage bias power supply) 118 function as an actuator for controlling parameters constituting a plasma processing condition. The actuator includes a pressure controlling valve for controlling vacuum pressure within a chamber 111. The run-to-run control unit 131 and the plasma observation unit 132 are realized by, for example, programs operating on a computer. A CPU of this computer is configured mainly by a microprocessor to execute the program stored in the memory that carries out the run-to-run control and to carry out the plasma observation control. The plasma processing apparatus carries out the plasma processing using a recipe serving as a processing condition for the wafer such that the light emission intensity of the wavelength ID matches the light emission target value, in other words, slope data through controlling of the recipe. Factors controlling the recipe include, as a changed recipe, a type and a flow rate of the processed gas, a processing pressure, electric power for plasma generation, radio frequency bias electric power, or the like, and as a coefficient determining a changed amount of the recipe, include a plurality of parameters such as a processing time period. Due to accumulation of reaction products on an inner wall of a plasma processing chamber, changes in temperatures of components within the plasma processing chamber, wear of components within the plasma processing chamber, and the like, an environment within the plasma processing chamber varies in accordance with the number of processed wafers. For this reason, while a state of the plasma processing is monitored, the processing is carried out through the run-to-run control program by correcting the recipe such that a state of plasma matches the light emission target value for each wafer.

A method for carrying out the plasma processing by applying the radio frequency electric power to the electrodes has been exemplified here. However, another method of the plasma processing such as a plasma processing method for generating plasma by introducing a microwave into the chamber may be employed.

A wafer to be processed is conveyed into the chamber 111 and subjected to plasma etching processing using the plasma processing condition based on the recipe. Once the plasma etching processing is completed, the wafer is conveyed out thereof and the next wafer is conveyed into the chamber 111 to be subjected to the plasma etching processing.

Operation variables for carrying out the run-to-run control are determined and stored to the memory in advance. Here, for example, the time intervals 45-97 for the average value of the determination coefficient in FIG. 15B having a larger correlation coefficient ($R^2$) indicating the degree of matching to a regression line are employed. In addition, in order to carry out the run-to-run control for each wafer processing, it is required to measure etching results for each wafer. Accordingly, a value of the plasma emission intensity for a combination of the wavelength ID and the time interval having a higher correlation between a process monitor value and plasma processing results is substituted for the plasma processing results. The value of the plasma emission intensity for the combination of the wavelength ID and the time interval is determined and stored to the memory in advance as a desired value (light emission target value) of the process monitor value for the run-to-run control. When the plasma processing for each wafer is carried out for the time intervals 1-100, the light emission intensity of plasma for the wavelength ID of 2 (Si, 288) and the time intervals 45-97 serves as the operation variable, which is to be controlled by the process monitor. In other words, the plasma processing for the time intervals 1-44 and the time intervals 98-100 are not to be controlled and observed by the process monitor.

Figure 17B:
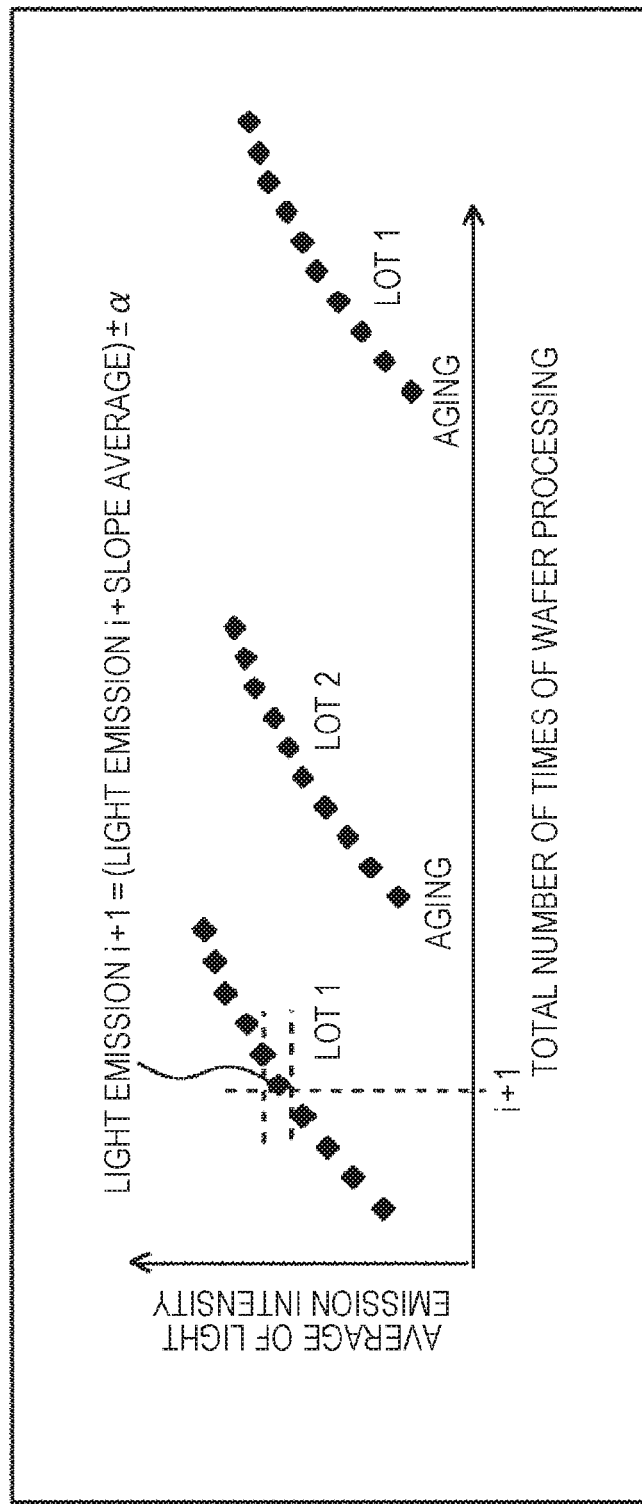
FIG. 17B is a diagram for explaining control of the plasma processing based on the correlation data in the third working example.

FIG. 17B is a diagram for explaining control of the plasma processing based on the correlation data in the third working example. In FIG. 17B, when the current number of times of wafer processing is assumed to be i and the average of the light emission intensity is assumed to be light emission i within the time intervals 45-97, the light emission target value (light emission i+1) for the next number of times of wafer processing i+1 is expressed by (light emission i+slope average)±α.

Note that α is a tolerance value in controlling. For example, in a case where a value of the monitored plasma emission intensity is smaller than the light emission target value, a power supply for plasma generation and a gas supplying unit are controlled such that the plasma emission intensity for the next wafer processing is increased to match the light emission target value.

The value of the process monitor determined as described above, that is, the light emission intensity of plasma of the wavelength ID of 2 (Si, 288) for the time intervals 45-97 is acquired for each wafer processing for each lot, and a correction amount for the next processing is calculated by the microprocessor such that the light emission intensity falls within an allowable range relative to a predetermined light emission target value. Thereafter, this correction amount is added to a parameter corresponding to the operation variable of the recipe for the next wafer, which is to be stored to the memory.

The run-to-run control program transmits information on the corrected recipe to, for example, the gas supplying unit serving as the actuator such that the etching processing for the next wafer is carried out in accordance with the corrected recipe.

Meanwhile, in a case where the light emission i serving as the average of the light emission intensity falls outside the range of the tolerance value a in controlling, a plasma observation program raises an alarm.

After the processing per lot is repeated for a predetermined number of times as described above, cleaning processing or aging processing for the chamber 111 is carried out.

When "data for a combination of the wavelength ID and the time interval" satisfying a predetermined condition employed through the method according to the first working example is present out of the range of the time intervals 45-97, the run-to-run control is carried out using that data. For a time interval without such data, run-to-run control based on other data or parameters may be carried out as necessary.

According to the working example, a combination of the wavelength and the time interval of an element having a higher correlation is calculated per lot to be used to observe or control the plasma processing. Therefore, the plasma processing can be properly carried out or an alarm can be properly raised in accordance with an adhesion state of reaction products or a wear state of components.

The present invention has been specifically described thus far based on the embodiment. However, the invention is not limited to the aforementioned embodiment and can be variously modified without departing from the scope thereof.

What is claimed is:

1. An apparatus comprising: a computing unit configured to: analyze light emission data, obtained by a process monitor, of a plasma etching processing of a sample at a plurality of wavelengths of light at a plurality of time intervals; acquire correlation data at each of a plurality of combinations of respective time intervals and respective wavelengths, wherein the correlation data includes, for each of the plurality of combinations of the respective time intervals and the respective wavelengths, a respective direction of correlation between a respective light emission intensity for a respective wavelength, determine elements of the plasma having the respective direction of correlation which match each other, and identify an optimum combination of the time interval and the wavelength from the combinations of the respective time intervals and the respective wavelengths by using the correlation data corresponding to the determined elements as an indicator, and output a signal to a controller; and the controller is configured to receive the signal output by the computing unit and control the plasma etching processing of the sample using the identified optimum combination of the time interval and the wavelength to reduce a number of combinations of the time interval and the wavelength used to control the plasma etching processing.

2. The apparatus according to claim 1, wherein the computing unit is further configured to acquire the correlation data per lot, the lot being a group of samples subjected to the plasma etching processing between a cleaning processing.

3. The apparatus according to claim 1, wherein the computing unit is further configured to compute the correlation data such that respective time intervals in which there is too much variation in the light emission intensity are excluded from being identified as a target of analysis.

4. The apparatus according to claim 2, wherein the respective light emission intensity is an average value of the respective light emission data for the respective time interval.

5. The apparatus according to claim 2, wherein the respective time intervals are acquired by dividing stable intervals in which the light emission intensity of plasma etching processing is under a stable condition.

* * * * *